US012720979B2

(12) United States Patent
Xie et al.

(10) Patent No.: US 12,720,979 B2
(45) Date of Patent: Aug. 25, 2026

(54) DISPLAY PANEL, STRETCHABLE DISPLAY PANEL AND DISPLAY APPARATUS

(71) Applicant: BOE Technology Group Co., Ltd., Beijing (CN)

(72) Inventors: Chunyan Xie, Beijing (CN); Pinfan Wang, Beijing (CN); Song Zhang, Beijing (CN); Paoming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 387 days.

(21) Appl. No.: 18/278,408

(22) PCT Filed: Aug. 16, 2022

(86) PCT No.: PCT/CN2022/112812

§ 371 (c)(1),
(2) Date: Aug. 23, 2023

(87) PCT Pub. No.: WO2024/036483

PCT Pub. Date: Feb. 22, 2024

(65) Prior Publication Data

US 2025/0017060 A1 Jan. 9, 2025

(51) Int. Cl.
*H10K 59/131* (2023.01)
*H10K 59/80* (2023.01)
*H10K 77/10* (2023.01)

(52) U.S. Cl.
CPC ..... *H10K 59/131* (2023.02); *H10K 59/80516* (2023.02); *H10K 59/80522* (2023.02); *H10K 77/111* (2023.02)

(58) Field of Classification Search
CPC ........... H10K 59/131; H10K 59/80516; H10K 59/80522; H10K 77/111; H10K 59/122;
(Continued)

(56) References Cited

U.S. PATENT DOCUMENTS 11,056,472 B2 7/2021 Kim et al.
2016/0190389 A1 6/2016 Lee et al.
(Continued)

FOREIGN PATENT DOCUMENTS

CN 107221549 A 9/2017
CN 110504386 A 11/2019
(Continued)

*Primary Examiner* — Steven B Gauthier
*Assistant Examiner* — Alvin L Lee
(74) *Attorney, Agent, or Firm* — XSENSUS LLP

(57) ABSTRACT

Provided is a stretchable display panel, including: a flexible substrate, including a plurality of island regions spaced apart from each other, a plurality of bridge regions configured to connect the plurality of island regions, and a first hollowed hole surrounded by the island regions and the bridge regions; a plurality of unit display portions, each of the unit display portions including a display region and a non-display region on a periphery of the display region, and including a drive backplane, and an anode layer, a light-emitting layer, and a cathode layer which are stacked on the drive backplane; and connecting portions, disposed on the bridge regions and configured to connect the adjacent unit display portions. The drive backplane includes a partition groove in the non-display region. A portion of the cathode layer inside the partition groove is disconnected from a portion of the cathode layer outside the partition groove.

16 Claims, 9 Drawing Sheets

(58) Field of Classification Search
CPC . H10K 59/124; H10K 59/129; H10K 59/8731
See application file for complete search history.

(56) References Cited

U.S. PATENT DOCUMENTS

| | | | | |
|---|---|---|---|---|
| 2017/0278920 | A1 | 9/2017 | Park et al. | |
| 2020/0403171 | A1 | 12/2020 | Park et al. | |
| 2020/0410909 | A1 | 12/2020 | Jung et al. | |
| 2021/0005700 | A1 * | 1/2021 | Park | H10K 59/131 |
| 2021/0066653 | A1 | 3/2021 | Luo | |
| 2021/0151531 | A1 | 5/2021 | Jo et al. | |
| 2022/0199729 | A1 | 6/2022 | Yun et al. | |
| 2022/0384545 | A1 | 12/2022 | Shen et al. | |
| 2022/0407023 | A1 | 12/2022 | Zhu et al. | |
| 2023/0016636 | A1 * | 1/2023 | Wang | G09G 3/035 |
| 2023/0075199 | A1 | 3/2023 | Tian et al. | |
| 2024/0016030 | A1 | 1/2024 | Lin | |

FOREIGN PATENT DOCUMENTS

| | | | | | |
|---|---|---|---|---|---|
| CN | 111211243 | A | | 5/2020 | |
| CN | 111370454 | A | * | 7/2020 | G09F 9/301 |
| CN | 111653595 | A | | 9/2020 | |
| CN | 111682049 | A | | 9/2020 | |
| CN | 111864067 | A | * | 10/2020 | H10K 77/111 |
| CN | 112071893 | A | * | 12/2020 | H10K 59/873 |
| CN | 112117306 | A | | 12/2020 | |
| CN | 112185997 | A | | 1/2021 | |
| CN | 112397457 | A | | 2/2021 | |
| CN | 112490272 | A | | 3/2021 | |
| CN | 112670330 | A | | 4/2021 | |
| CN | 112820757 | A | | 5/2021 | |
| CN | 113540196 | A | | 10/2021 | |
| CN | 114141827 | A | | 3/2022 | |
| CN | 114649372 | A | | 6/2022 | |

* cited by examiner

E-E'

DISPLAY PANEL, STRETCHABLE DISPLAY PANEL AND DISPLAY APPARATUS

CROSS-REFERENCE TO RELATED APPLICATION

The present disclosure is a U.S. national stage of international application No. PCT/CN2022/112812, filed on Aug. 16, 2022, the content of which is herein incorporated by reference in its entirety.

TECHNICAL FIELD

The present disclosure relates to the field of display technologies, and in particular, relates to a display panel, a stretchable display panel and a display apparatus.

BACKGROUND

At present, display panels have received widespread attention. In particular, the display panels are foldable, rollable, or stretchable. This brings completely new experience for users.

SUMMARY

Embodiments of the present disclosure provide a display panel, a stretchable display panel, and a display apparatus. The technical solutions are summarized as follows.

According to some embodiments of the present disclosure, a stretchable display panel is provided.

The stretchable display panel includes: a flexible substrate, including a plurality of island regions spaced apart from each other and a plurality of bridge regions configured to connect the plurality of island regions, and including a first hollowed hole surrounded by the island regions and the bridge regions; a plurality of unit display portions, respectively disposed on the plurality of island regions, each unit display portion being provided with a display region and a non-display region on a periphery of the display region, each of the unit display portions including a backplane, and an anode layer, a light-emitting layer and a cathode layer which are stacked on the drive backplane; and connecting portions, disposed on the bridge regions and configured to connect the adjacent unit display portions, wherein the drive backplane is provided with a partition groove in the non-display region, and a portion of the cathode layer inside the partition groove is disconnected from a portion of the cathode layer outside the partition groove.

In some embodiments, a recessed structure is disposed in an inner wall of the partition groove.

In some embodiments, the drive backplane in the unit display portion includes a first inorganic insulation layer and an organic insulation layer which are stacked, the organic insulation layer being more proximal to the flexible substrate than the first inorganic insulation layer, wherein the partition groove runs through at least portions of the first inorganic insulation layer and the organic insulation layer, and a side of the first inorganic insulation layer proximal to the partition groove is more protrusive than a side of the organic insulation layer proximal to the partition groove.

In some embodiments, the partition groove includes a first sub partition groove in the first inorganic insulation layer, and a second sub partition groove in the organic insulation layer, wherein an orthographic projection of the first sub partition groove on the flexible substrate is within in an orthographic projection of the second sub partition groove on the flexible substrate, and an outer boundary of the orthographic projection of the second sub partition groove on the flexible substrate is not coincident with an outer boundary of the orthographic projection of the first sub partition groove on the flexible substrate.

In some embodiments, the drive backplane in the unit display portion further includes a second inorganic insulation layer on a side, distal from the flexible substrate, of the first inorganic insulation layer, the second inorganic insulation layer covering the partition groove.

In some embodiments, a portion of the organic insulation layer in the non-display region is provided with a first organic isolation groove; in a direction parallel to the flexible substrate, the partition groove is more proximal to the display region than the first organic isolation groove; and the first inorganic insulation layer covers a side wall of the first organic isolation groove.

In some embodiments, the drive backplane in the unit display portion further includes a plurality of inorganic layers stacked on a side of the organic insulation layer proximal to the flexible substrate, wherein an orthographic projection of the first organic isolation groove on the flexible substrate has an overlapping region with an orthographic projection of at least one inorganic layer on the flexible substrate.

In some embodiments, the unit display portion further includes a first inorganic package layer, an organic package layer, and a second inorganic package layer which are stacked on a side, distal from the drive backplane, of the cathode layer; a portion of the organic package layer in the non-display region is provided with a second organic isolation groove, and an orthographic projection of the second organic isolation groove on the flexible substrate has an overlapping region with an orthographic projection of the first organic isolation groove on the flexible substrate; and the first inorganic package layer and the second inorganic package layer both cover a side wall of the second organic isolation groove.

In some embodiments, the partition groove and the first organic isolation groove are both annular, the partition groove is distributed around the periphery of the display region of the unit display portion, and the first organic isolation groove is distributed around a periphery of the partition groove.

In some embodiments, the number of partition grooves in the unit display portion is plural; and for a plurality of partition grooves in the same unit display portion, the plurality of partition grooves is nested in sequence, and all distributed around the periphery of the display region of the unit display portion.

In some embodiments, a portion of the light-emitting layer is disposed in the partition groove, and the portion of the light-emitting layer inside the partition groove is disconnected from a portion of the light-emitting layer outside the partition groove.

In some embodiments, the unit display portion further includes an auxiliary electrode, in the direction parallel to the flexible substrate, the auxiliary electrode is more proximal to the display region than the partition groove, and a side wall of the auxiliary electrode is provided with a groove, the auxiliary electrode is configured to be electrically connected to a first power signal line disposed in the drive backplane, wherein a portion of the light-emitting layer disposed on the auxiliary electrode is disconnected from a portion of the light-emitting layer disposed outside the auxiliary electrode, and the cathode layer extends into the groove and is in contact with the groove.

In some embodiments, the auxiliary electrode includes a first sub-electrode, a second sub-electrode and a third sub-electrode which are stacked, the second sub-electrode being disposed between the first sub-electrode and the third sub-electrode, the first sub-electrode being more proximal to the flexible substrate than the third sub-electrode, wherein in the direction parallel to the flexible substrate, the first sub-electrode is more protrusive than the second sub-electrode, and the third sub-electrode is more protrusive than the second sub-electrode; and the cathode layer is in contact with the first sub-electrode.

In some embodiments, the unit display portion further includes a pixel definition layer disposed on the drive backplane, the pixel definition layer being provided at least one pixel hole and at least one cathode lap via; and the anode layer includes at least one anode block in one-to-one correspondence to the at least one pixel hole, and at least one cathode lapping electrode in one-to-one correspondence to the at least one cathode lap via, wherein the anode block is disposed in the corresponding pixel hole, the cathode lapping electrode is disposed in the corresponding cathode lap via, and the cathode lapping electrode is electrically connected to the first power signal line disposed in the drive backplane; and the cathode layer is lapped with the cathode lapping electrode by the cathode lap via.

In some embodiments, the drive backplane in the unit display portion includes at least one pixel drive circuit electrically connected to at least one anode block in one-to-one correspondence, and a plurality of first signal lines electrically connected to the pixel drive circuit; the connecting portion includes a plurality of second signal lines; the stretchable display panel further includes a plurality of connecting signal lines, one portion of the connecting signal lines being disposed in the unit display portions, the other portion thereof being disposed in the connecting portions, wherein first ends of the plurality of connecting signal lines are electrically connected to the plurality of first signal lines in one-to-one correspondence, and second ends of the plurality of connecting signal lines are electrically connected to the plurality of second signal lines in one-to-one correspondence.

In some embodiments, the drive backplane in the unit display portion includes a first planarization layer covering the pixel drive circuit, a connecting electrode disposed on a side, distal from the flexible substrate, of the first planarization layer, and a second planarization layer disposed on a side, distal from the first planarization layer, of the connecting electrode, and the pixel drive circuit is electrically connected to the corresponding anode block by the connecting electrode; and the connecting portion further includes a third planarization layer disposed in a same layer and made of a same material as the first planarization layer, and a fourth planarization layer disposed in a same layer and made of a same material as the second planarization layer, wherein a portion in the third planarization layer is in contact with the flexible substrate, one portion of the plurality of second signal lines is disposed between the flexible substrate and the third planarization layer, and the other portion of the second signal lines is disposed between the third planarization layer and the fourth planarization layer.

In some embodiments, the pixel drive circuit includes a storage capacitor and at least one transistor. The storage capacitor includes a first capacitive electrode and a second capacitive electrode disposed opposite to each other, wherein the first capacitive electrode is more proximal to the flexible substrate than the second capacitive electrode, and the first capacitive electrode is disposed in a same layer and made of a same material as a gate in the transistor; wherein in the case that the partition groove runs through the first planarization layer and the second planarization layer at the same time, the plurality of connecting signal lines are disposed in a same layer and made of a same material as at least one of the first capacitive electrode and the second capacitive electrode; or in the case that the partition groove runs through the second planarization layer but does not run through the first planarization layer, the plurality of connecting signal lines are disposed in the same layer and made of the same material as at least one of the first capacitive electrode, the second capacitive electrode and a source and drain of the transistor.

In some embodiments, the second signal lines disposed between the flexible substrate and the third planarization layer among the plurality of second signal lines are disposed in a same layer and made of a same material as the source and drain of the transistor, and the second signal lines disposed between the third planarization layer and the fourth planarization layer among the plurality of second signal lines are disposed in a same layer and made of a same material as the connecting electrode.

In some embodiments, the connecting portion further includes at least one inorganic protective layer disposed on a side, distal from the flexible substrate, of the fourth planarization layer, the inorganic protective layer covering the fourth planarization layer.

According to some embodiments of the present disclosure, a display panel is provided.

The display panel includes a flexible substrate, and a plurality of unit display portions disposed on the flexible substrate, wherein the unit display portion is provided with a display region, and a non-display region disposed on a periphery of the display region, and the unit display portion includes a drive backplane, and an anode layer, a light-emitting layer and a cathode layer which are stacked on the drive backplane, wherein the drive backplane is provided with a partition groove disposed in the non-display region, and a portion of the cathode layer disposed inside the partition groove is disconnected from a portion of the cathode layer disposed outside the partition groove.

According to some embodiments of the present disclosure, a stretchable display panel is provided.

The stretchable display panel includes: a flexible substrate, including a plurality of island regions spaced apart from each other, and a plurality of bridge regions configured to connect the plurality of island regions, the flexible substrate being provided with a first hollowed hole surrounded by the island regions and the bridge regions; a plurality of unit display portions, respectively disposed on the plurality of island regions, each unit display portion being provided with a display region and a non-display region disposed on a periphery of the display region, each of the unit display portions including a drive backplane, and an anode layer, a light-emitting layer and a cathode layer which are stacked on the drive backplane; and connecting portions, disposed on the bridge regions and configured to connect the adjacent unit display portions, wherein the drive backplane is provided with a partition groove and a first organic isolation groove which are disposed in the non-display region, wherein the partition groove runs at least partially through film layers of two different materials, and the first organic isolation groove runs at least partially through a film layer of an organic material; in a direction parallel to the flexible substrate, the partition groove is more proximal to the display region than the first organic isolation groove; and a portion of the cathode layer disposed inside the partition groove is disconnected from a portion of the cathode layer disposed outside the partition groove.

According to some embodiments of the present disclosure, a display apparatus is provided.

The display apparatus includes a power supply component, and a display panel electrically connected to the power supply component, wherein the display panel is the above-mentioned stretchable display panel, or the display panel is the above-mentioned display panel.

BRIEF DESCRIPTION OF DRAWINGS

To describe the technical solutions of the embodiments of the present disclosure more clearly, the following briefly introduces the accompanying drawings required for describing the embodiments. Apparently, the accompanying drawings in the following description illustrate only some embodiments of the present disclosure, and a person of ordinary skill in the art may still derive other drawings from these accompanying drawings without creative efforts.

DETAILED DESCRIPTION

To make the objectives, technical solutions, and advantages of the present disclosure clearer, the following further describes exemplary embodiments of the present disclosure in detail with reference to the accompanying drawings.

The display panel generally includes a plurality of pixel islands, and inter-island connectors configured to connect adjacent pixel islands, wherein each pixel island includes a plurality of light-emitting devices, and a package layer configured to seal the light-emitting devices.

However, the pixel islands in the current display panel only use the package layer to seal the light-emitting devices inside, and the package layer has a poor sealing effect on the light-emitting devices. As a consequence, the light-emitting devices are easily failed due to erosion by water and oxygen in the external environment, and hence the display panel has a shorter service life.

Figure 1:
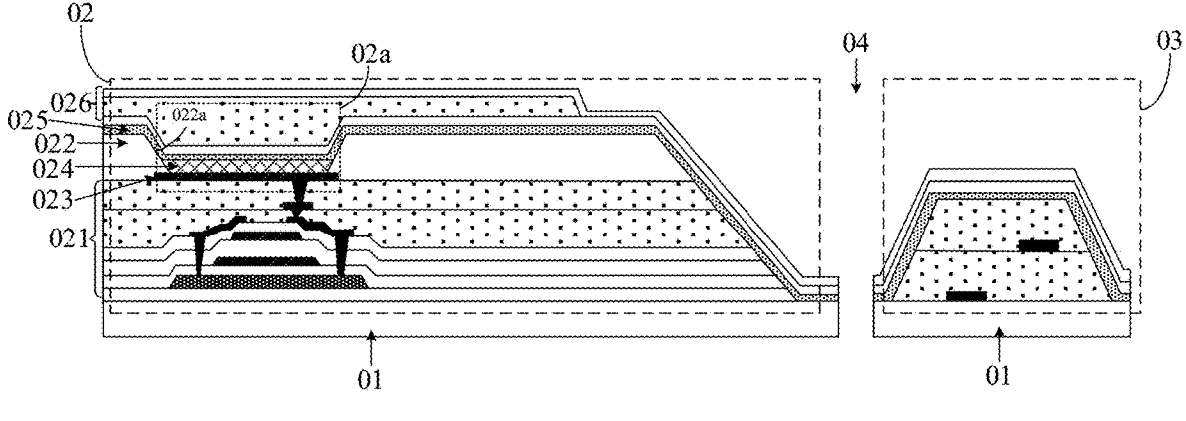
FIG. 1 is a cross-sectional view of a film layer of a display panel.

Referring to FIG. 1, FIG. 1 is a cross-sectional view of a film layer of a stretchable display panel. The stretchable display panel includes a flexible substrate 01, a plurality of pixel islands 02 disposed on the flexible substrate 01, and inter-island connectors 03 configured to connect adjacent pixel islands 02. Here, the stretchable display panel has a hollowed structure 04 surrounded by the pixel islands 02 and the inter-island connectors 03. The stretchability of the stretchable display panel is improved by the hollowed structure 04, such that the stretchable display panel is stretched normally.

Each pixel island 02 includes a drive backplane 021, and a pixel definition layer 022, an anode layer 023, a light-emitting layer 024, a cathode layer 025 and a package layer 026 which are disposed on the drive backplane 021. The pixel definition layer 022 is provided with at least one pixel hole 022*a*. Within the same pixel hole 022*a*, a portion of the anode layer 023 disposed in this pixel hole 022*a*, a portion of the light-emitting layer 024 disposed in this pixel hole 022*a*, and a portion of the cathode layer 025 disposed in this pixel hole 022*a* defines a light-emitting device 02*a*. The package layer 026 is configured to seal the light-emitting device 02*a*.

Since the cathode layer 025 in the pixel island 02 is provided in a whole layer, the cathode layer 025 in the pixel island 02 extends to the periphery of the hollowed structure 04 surrounded by the pixel islands 02 and the inter-island connectors 03. However, the cathode layer 025 provided around the hollowed structure 04 is covered by an inorganic package layer in the package layer 026, such that the cathode layer 025 disposed around the hollowed structure 04 is exposed to the external environment, and the cathode layer 025 absorbs moisture in the external environment. In this way, the moisture in the external environment enters the cathode layer 025 from the hollowed structure 04, and the moisture entering the cathode layer 025 is easily transferred into the light-emitting layer 024, such that the package layer 026 is no longer effectively seal the light-emitting device 02*a*, which in turn leads to the failure of the light-emitting device 02*a* due to erosion by water, thereby resulting in a short service life of the stretchable display panel.

Figure 2:
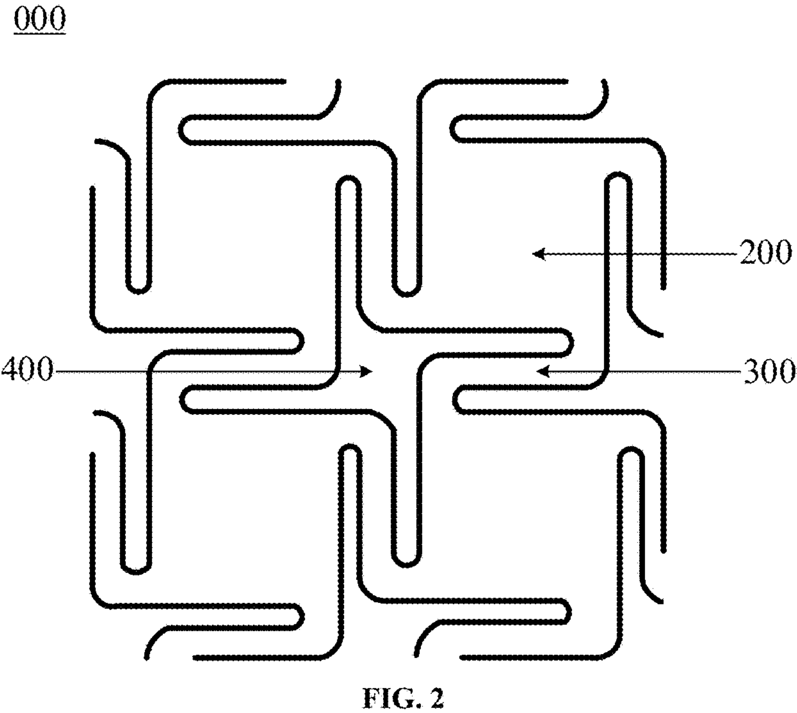
FIG. 2 is a top view of a display panel according to some embodiments of the present disclosure.

Referring to FIG. 2, FIG. 2 is a top view of a display panel according to some embodiments of the present disclosure. The display panel 000 includes a flexible substrate 100, and a plurality of unit display portions 200 disposed on the flexible substrate 100.

In the present disclosure, the display panel 000 is a rollable display panel, or a stretchable display panel.

In the case that the display panel 000 is the rollable display panel, the flexible substrate 100 is provided with a plurality of via holes distributed around each unit display portion 200. The flexibility of the flexible substrate 100 is improved by providing the plurality of via holes in the flexible substrate 100, thereby improving the flexibility of the display panel 000. In this way, the display panel 000 is rolled.

In the case that the display panel 000 is the stretchable display panel, the flexible substrate 100 includes a plurality of island regions 102 spaced apart from each other (not indicated in FIG. 2), and a plurality of bridge regions 101 configured to connect the plurality of island regions 102 (not indicated in FIG. 2). The plurality of unit display portions 200 in the display panel 000 are distributed on the plurality of island regions 102. The display panel 000 further includes connecting portions 300 disposed on the bridge regions 101, wherein the connecting portions 300 are configured to connect adjacent unit display portions 200. The display panel 000 is provided with a first hollowed hole 400*a* (not indicated in FIG. 2) surrounded by the island regions 102 and the bridge regions 101, and a second hollowed hole 400*b* (not indicated in FIG. 2) surrounded by the unit display portions 200 and the connecting portions 300. Here, the first hollowed hole 400*a* is communicated with the second hollowed hole 400*b*. The first hollowed hole 400*a* and the second hollowed hole 400*b* which are communicated with each other are configured to define the hollowed structure 400. In this way, by providing the hollowed structure 400 in the display panel 000, the flexibility of the display panel 100 is improved, and the connecting portions 300 in the display panel 000 are deformed to a certain extent, such that a tensile force is applied to the display panel 000, a spacing between every two adjacent unit display portions 200 is adjusted by means of the deformation of the connecting portions 300, and further the display panel 000 is stretched.

It should be noted that the following embodiments are exemplarily described by taking the display panel 000 being the stretchable display panel as an example.

Figure 3:
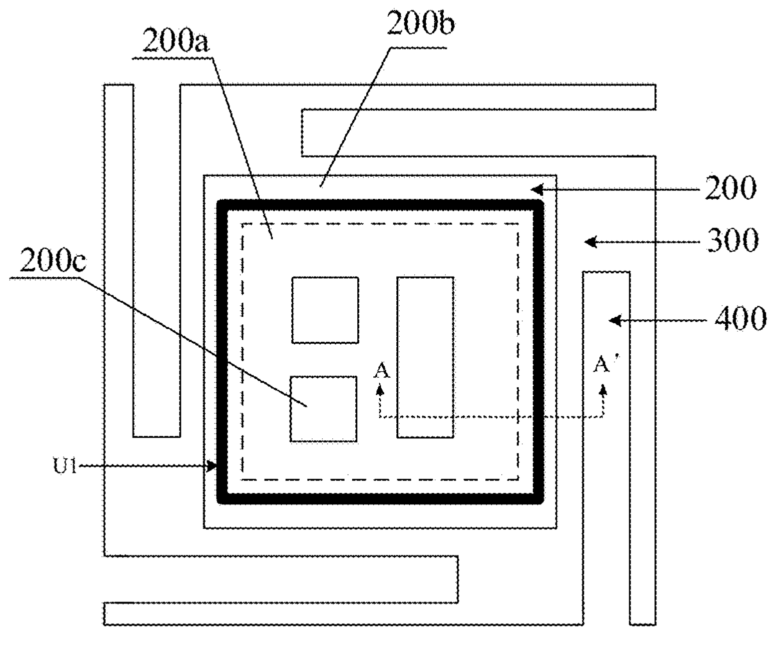
FIG. 3 is a schematic structural diagram of an individual unit display portion in the display panel illustrated in FIG. 2.
Figure 4:
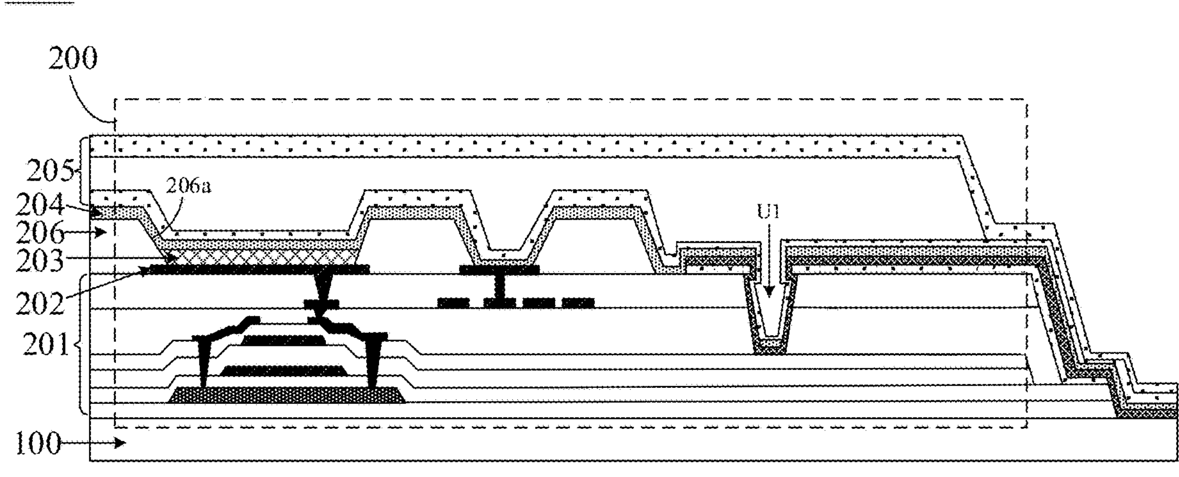
FIG. 4 is a schematic diagram of a film layer structure of the unit display portion illustrated in FIG. 3 at A-A'.

In order to more clearly see the structure of the unit display portion 200 in the stretchable display panel 000, referring to FIG. 3 and FIG. 4, FIG. 3 is a schematic structural diagram of an individual unit display portion in the display panel illustrated in FIG. 2, and FIG. 4 is a schematic structural diagram of a film layer of the unit display portion illustrated in FIG. 3 at A-A'. The unit display portion 200 in the display panel 000 is provided with a display region 200*a*, and a non-display region 200*b* disposed on the periphery of the display region 200*a*. In addition, the unit display portion 200 includes a drive backplane 201, and an anode layer 202, a light-emitting layer 203 and a cathode layer 204 which are stacked on the drive backplane 201.

In some embodiments, the unit display portion 200 generally further includes a pixel definition layer 206 disposed on the drive backplane 201. The pixel definition layer 206 in the unit display portion 200 is typically provided with at least one pixel hole 206*a*. For any pixel hole 206*a* in the pixel definition layer 206, a portion of the anode layer 202 disposed in this pixel hole 206*a*, a portion of the light-emitting layer 203 disposed in the pixel hole 206*a*, and a portion of the cathode layer 204 disposed in the pixel hole 206*a* are configured to define a light-emitting device 200*c*.

Thus, each unit display portion 200 in the display panel 000 includes at least one light-emitting device 200*c*, and each light-emitting device 200*c* in the unit display portion 200 is distributed in the display region 200*a* of the unit display portion 200. For example, each unit display portion 200 includes at least three different types of light-emitting devices 200*c*, which are a red light-emitting device configured to emit red light, a green light-emitting device configured to emit green light, and a blue light-emitting device configured to emit blue light.

Here, the drive backplane 201 in each unit display portion 200 drive the light-emitting device 200*c* disposed in the unit display portion 200 to emit light, thereby ensuring that the display panel 000 display a screen normally. In the present disclosure, the unit display portion 200 generally further includes a package layer 205 configured to seal the light-emitting device 200*c*. Through the package layer 205, the probability of the failure of the light-emitting device 200*c* due to the erosion by moisture in the external environment to the light-emitting device 200*c* is reduced.

The drive backplane 201 of the unit display portion 200 is provided with a partition groove U1 disposed in the non-display region 200*b*. A portion of the cathode layer 204 disposed on the drive backplane 201, which is disposed inside the partition groove U1, is disconnected from a portion of the cathode layer disposed outside the partition groove U1.

In the embodiments of the present disclosure, although the cathode layer 204 disposed on the drive backplane 201 in the unit display portion 200 is provided in a whole layer, the cathode layer 204 also extends to the periphery of the hollowed structure 400 of the display panel 000. However, the drive backplane 201 in the unit display portion 200 is provided with the partition groove U1 disposed in the non-display region 200*b*, and the cathode layer 204 is separated by the partition groove U1. Therefore, even if the cathode layer 204 provided around the hollowed structure 400 is still exposed to the external environment, and the cathode layer 204 still absorbs moisture in the external environment, the moisture entering the cathode layer 204 is blocked by the partition groove U1, such that the moisture is not transferred through the cathode layer 204 to the light-emitting layer 203 in the display region 200*a* of the unit display portion 200, thereby causing the package layer 205 in the unit display portion 200 to effectively seal the light-emitting device 200*c*. In this way, the probability of the failure of the light-emitting device 200*c* due to the erosion by moisture is reduced, and the service life of the display panel 000 is effectively prolonged.

In summary, the display panel according to the embodiments of the present disclosure includes a flexible substrate, and a plurality of unit display portions disposed on the flexible substrate. The drive backplane in the unit display portion is provided with a partition groove disposed in the non-display region, by which the cathode layer is separated. Therefore, even if the cathode layer disposed around the hollowed structure of the display panel is still exposed to the external environment, and the cathode layer still absorbs moisture in the external environment, the moisture entering the cathode layer is blocked by the partition groove, such that the moisture is not transferred through the cathode layer to the light-emitting layer in the display region of the unit display portion, thereby causing the package layer in the unit display portion to effectively seal the light-emitting device to reduce the probability of the failure of the light-emitting device due to erosion by moisture. In this way, the service life of the display panel is effectively prolonged.

Figure 5:
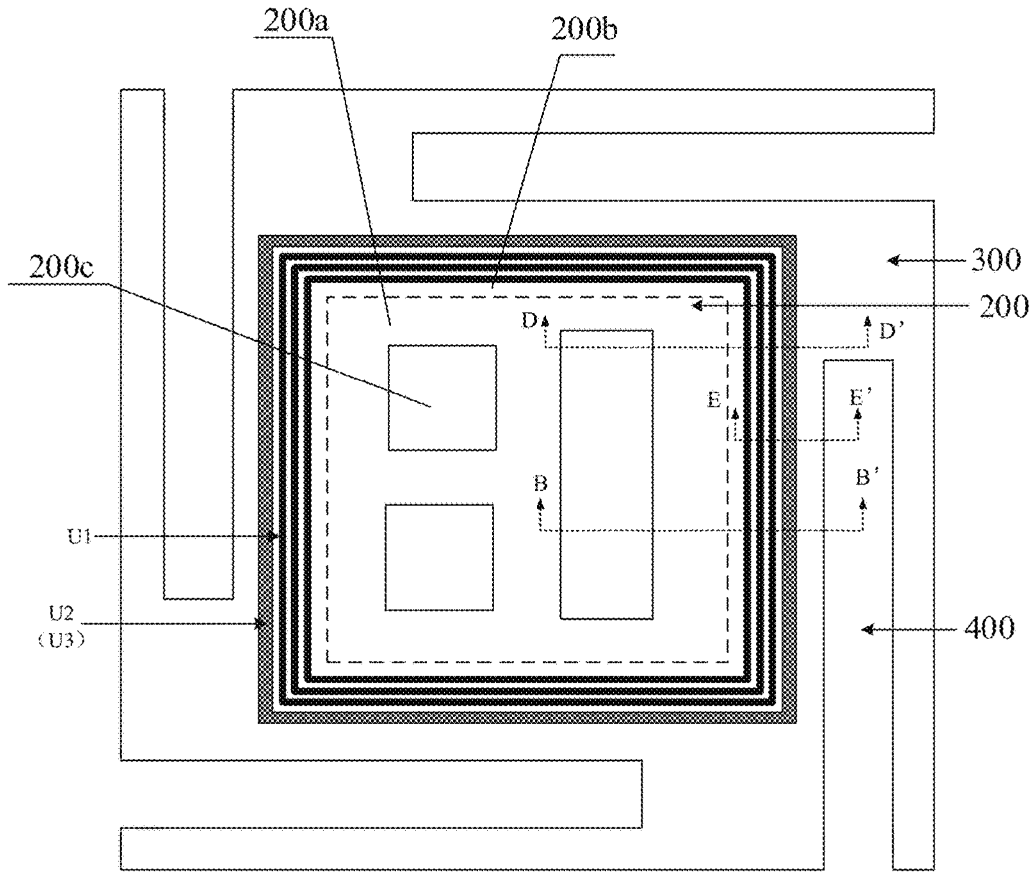
FIG. 5 is another schematic structural diagram of an individual unit display portion in the display panel illustrated in FIG. 1.
Figure 6:
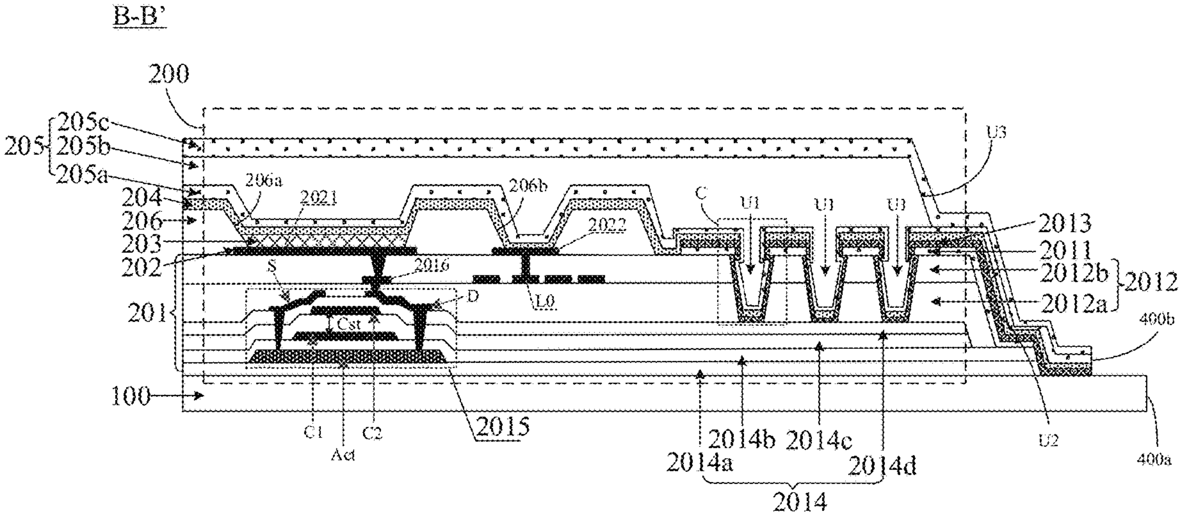
FIG. 6 is a schematic diagram of the film layer structure of the unit display portion illustrated in FIG. 5 at B-B'.
Figures 7, 8:
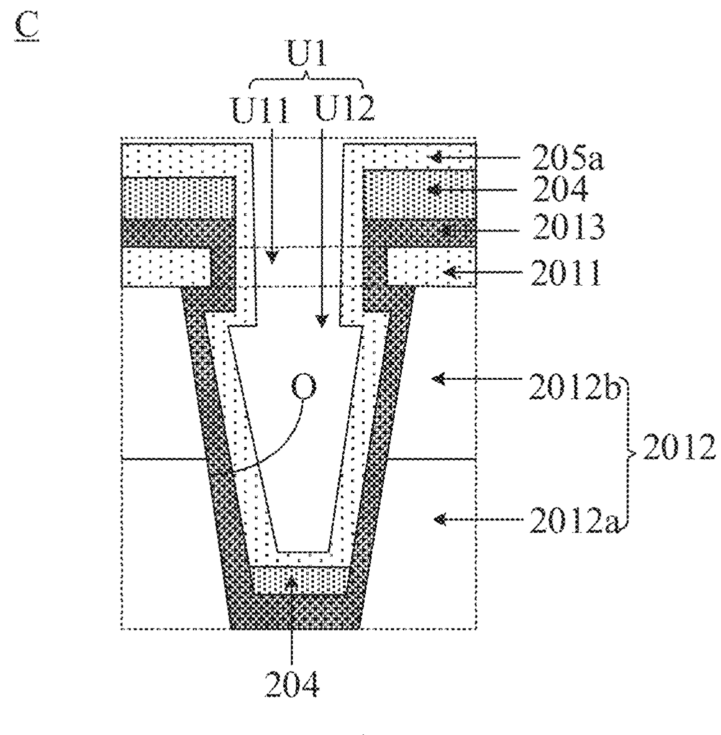
FIG. 7 is a partial enlarged view of the film layer structure illustrated in FIG. 6 at C.
FIG. 8 is a cross-sectional view of the display panel illustrated in FIG. 5 at D-D'.

In some embodiments of the present disclosure, referring to FIG. 5, FIG. 6, and FIG. 7, FIG. 5 is another schematic structural diagram of an individual unit display portion in the display panel illustrated in FIG. 1, FIG. 6 is a schematic diagram of a film layer structure of the unit display portion illustrated in FIG. 5 at B-B', and FIG. 7 is a partial enlarged view of the film layer structure illustrated in FIG. 6 at C. The partition groove U1 disposed in the drive backplane 201 in the unit display portion 200 has a recessed structure O on an inner wall. In this way, in the process of forming the cathode layer 204 disposed in the whole layer by means of a deposition process, the cathode layer 204 deposited in the partition groove U1 is disposed in the recessed structure O, while a portion of the cathode layer 204 deposited outside the partition groove U1 is disposed on a side, distal from the flexible substrate 100, of the drive backplane 201. Therefore, since the partition groove U1 has the recessed structure O on a side wall, the cathode layer 204 deposited in the recessed structure O and the cathode layer 204 disposed at a side, distal from the flexible substrate 100, of the drive backplane 201 are disconnected at the side wall of the partition groove U1. That is, the portion of the cathode layer 204 disposed in the partition groove U1 is disconnected from the portion of the cathode layer 204 disposed outside the partition groove U1.

In some embodiments, as illustrated in FIG. 5, the partition groove U1 in the drive backplane 201 is annular, and distributed around the periphery of the display region 200*a* of the unit display portion 200. In this way, the cathode layer 204 disposed in the display region 200*a* of the unit display portion 200 is separated from the cathode layer 204 disposed in a connecting portion 300 by the partition groove U1, in order to ensure that the moisture does not enter the display region 200*a* of the unit display portion 200 through the cathode layer 204, and then ensure that the probability of erosion by moisture to the light-emitting device 200*c* in the display region 200*a* of the unit display portion 200 is low.

For example, the number of partition grooves U1 in the drive backplane 201 is plural. For example, in FIG. 5 and FIG. 6, three partition grooves U1 are disposed in the drive backplane 201. For a plurality of partition grooves U1 in the drive backplane 201 in the same unit display portion 200, these partition grooves U1 are nested in sequence, and all distributed around the periphery of the display region 200*a* of this unit display portion 200. In this case, by providing the plurality of partition grooves U1 in the drive backplane 201, a separation effect on the cathode layer 203 is improved, thereby further reducing the probability of erosion by moisture to the light-emitting device 200*c* in the display region 200*a* of the unit display portion 200.

In some embodiments of the present disclosure, as illustrated in FIG. 6 and FIG. 7, the drive backplane 201 in the unit display portion 200 includes a first inorganic insulation layer 2011 and an organic insulation layer 2012 which are stacked. The organic insulation layer 2012 is more proximal to the flexible substrate 100 than the first inorganic insulation layer 2011. Here, the organic insulation layer 2012 includes a first planarization layer 2012*a* and a second planarization layer 2012*b* which are stacked, wherein the first planarization layer 2012*a* is more proximal to the flexible substrate 100 than the second planarization layer 2012*b*.

In the present disclosure, the partition groove U1 disposed in the drive backplane 201 runs through at least portions of the first inorganic insulation layer 2011 and the organic insulation layer 2012, and a side of the first inorganic insulation layer 2011 proximal to the partition groove U1 is more protrusive than a side of the organic insulation layer 2012 proximal to the partition groove U1.

Therefore, a portion of the first inorganic insulation layer 2011, which is more protrusive than the organic insulation layer 2012, and a side of the organic insulation layer 2012 and a bottom proximal to the flexible substrate 100 define the recessed structure O. Here, a material of the first inorganic insulation layer 2011 is an inorganic material, and a material of the organic insulation layer 2012 is an organic material. In this way, in the process of forming the partition groove U1, the first inorganic insulation layer 2011 is etched using an etching material with a relatively small lateral etching rate for the inorganic material, and the organic insulation layer 2012 is etched using an etching material with a relatively large lateral etching rate for the organic material, and then the recessed structure O is formed on the side wall of the partition groove U1.

In the embodiments of the present disclosure, as illustrated in FIG. 7, the partition groove U1 in the drive backplane 201 includes a first sub partition groove U11 disposed in the first inorganic insulation layer 2011, and a second sub partition groove U12 disposed in the organic insulation layer 2012. An orthographic projection of the first sub partition groove U11 on the flexible substrate 100 is disposed in an orthographic projection of the second sub partition groove U12 on the flexible substrate 100, and an outer boundary of the orthographic projection of the second sub partition groove U12 on the flexible substrate 100 is not coincident with an outer boundary of the orthographic projection of the first sub partition groove U11 on the flexible substrate 100. In this way, aside wall of the first sub partition groove U11 in the first inorganic insulation layer 2011 is more protrusive than a side wall of the second sub partition groove U12 in the organic insulation layer 2012. That is, the recessed structure O is formed on the side wall of the partition groove U1.

In some embodiments, a distance between the outer boundary of the orthographic projection of the second sub partition groove U12 on the flexible substrate 100 and the outer boundary of the orthographic projection of the first sub partition groove U11 on the flexible substrate 100 ranges from 0.2 micron to 1 micron. In this way, not only can it be ensured that the cathode layer 204 deposited in the partition groove U1 is smoothly disconnected from the cathode layer 204 deposited outside the partition groove U1, but also ensured that a width of the portion of the first inorganic insulation layer 2011 that is more protrusive than the organic insulation layer 2012 is small, such that a portion in the first inorganic insulation layer 2011 proximal to the second sub partition groove U12 does not collapse, thereby ensuring that the structure of the partition groove U1 is relatively stable.

In the present disclosure, as illustrated in FIG. 6 and FIG. 7, the drive backplane 201 of the unit display portion 200 also includes a second inorganic insulation layer 2013 disposed on a side, distal from the flexible substrate 100, of the first inorganic insulation layer 2011. The second inorganic insulation layer 2013 covers the partition groove U1. In some embodiments, the bottom and side walls of the partition groove U1 are both covered with the second inorganic insulation layer 2013.

In this case, a material of the second inorganic insulation layer 2013 is an inorganic material, and the inorganic material isolates and seals the moisture in the external environment. Therefore, the partition groove U1 is sealed by the second inorganic insulation layer 2013, thereby preventing the moisture in the external environment from entering the display region 200*a* of the unit display portion 200 through the partition groove U1, and further reducing the probability of failure of the light-emitting device 200*c* due to erosion by moisture.

It should be noted that in other possible implementations, the second inorganic insulation layer 2013 is not disposed in the drive backplane 201, instead the partition groove U1 is covered with an inorganic package layer in the package layer 205, which also achieves the same effect of sealing the partition groove U1.

In the present disclosure, as illustrated in FIG. 5, FIG. 6 and FIG. 8, FIG. 8 is a cross-sectional view of the display panel shown in FIG. 5 at D-D'. A portion of the organic insulation layer 2012 in the drive backplane 201 in the unit display portion 200, which is disposed in the non-display region 200*b*, is provided with a first organic isolation groove U2. In the direction parallel to the flexible substrate 100, the partition groove U1 in the drive backplane 201 is more proximal to the display region 200*a* than the first organic isolation groove U2, and the first inorganic insulation layer 2011 in the drive backplane 2012 covers the side wall of the first organic isolation groove U2.

In some embodiments, the first organic isolation groove U2 is annular, and distributed around the periphery of the display region 200*a* of the unit display portion 200. In addition, because the partition groove U1 is more proximal to the display region 200*a* than the first organic isolation groove U2, the first organic isolation groove U2 is distributed around the periphery of the partition groove U1.

In this case, the material of the organic insulation layer 2012 is prone to absorb moisture in the external environment since it is an organic material, while the inorganic material isolates and seals the moisture in the external environment. Therefore, by providing the first organic isolation groove U2 in the organic insulation layer 2012, and allowing the first organic isolation groove U2 to be distributed around the display region 200*a* of the unit display portion 200, in the case that the side wall of the first organic isolation groove U2 is covered with the first inorganic insulation layer 2011 made of the inorganic material, the moisture in the external environment is effectively prevented from entering the display region 200*a* of the unit display portion 200 through the organic insulation layer 2012, and the probability of failure of the light-emitting device 200*c* due to erosion by moisture is further reduced. Moreover, by covering the side wall of the first organic insulation groove U2 with the first inorganic insulation layer 2011, it is also possible to prevent an undesirable phenomenon of spillage of the organic insulation layer 2012.

It should be noted that the drive backplane 201 contains the second inorganic insulation layer 2013, the second inorganic insulation layer 2013 also covers the side wall of the first organic isolation groove U2. In other possible implementations, the side wall of the first organic isolation groove U2 is also not covered with the first inorganic insulation layer 2011, nor the second inorganic insulation layer 2013, instead the side wall of the first organic isolation groove U2 is covered with the inorganic package layer in the package layer 205, which also achieves the same effect of sealing the organic insulation layer 2012.

In the embodiments of the present disclosure, the drive backplane 201 in the unit display portion 200 further includes a plurality of inorganic layers 2014 stacked on a side of the organic insulation layer 2012 proximal to the flexible substrate 100. In some embodiments, these inorganic layers 2014 include a buffer layer 2014*a*, a first gate insulation layer 2014*b*, a second gate insulation layer 2014*c* and an interlayer dielectric layer 2014*d* which are stacked vertically in a direction away from the flexible substrate 100. An orthographic projection of the first organic isolation groove U2 disposed in the organic insulation layer 2012 on the flexible substrate 100 has an overlapping region with an orthographic projection of at least one inorganic layer 2014 on the flexible substrate 100. In this way, by means of the inorganic layer 2014 whose orthographic projection on the flexible substrate 100 is overlapped with an orthographic projection of the first organic isolation groove U2, the moisture in the external environment is prevented from entering the organic insulation layer 2012 from the bottom of the first organic isolation groove U2.

In the present disclosure, the package layer 205 of the unit display portion 200 includes a first inorganic package layer 205*a*, an organic package layer 205*b* and a second inorganic package layer 205*c* which are stacked on a side, distal from the drive backplane 201, of the cathode layer 204. A portion of the organic package layer 205*b* in the package layer 205, which is disposed in the non-display region 200*b*, is provided with a second organic isolation groove U3, and the first inorganic package layer 205*a* and the second inorganic package layer 205*c* in the package layer 205 both cover aside wall of the second organic isolation groove U3. Here, an orthographic projection of the second organic isolation groove U3 on the flexible substrate 100 has an overlapping region with the orthographic projection of the first organic isolation groove U2 on the flexible substrate 100. In some embodiments, the orthographic projection of the first organic isolation groove U2 on the flexible substrate 100 is disposed in the orthographic projection of the second organic isolation groove U3 on the flexible substrate 100. In this way, the second organic isolation groove U3 is also distributed around the display region 200*a* of the unit display portion 200.

In this case, a material of the organic encapsulation layer 205*b* is prone to absorb moisture in the external environment since it is an organic material, while a material of the first inorganic package layer 205*a* and a material of the second inorganic package layer 205*c* are both inorganic materials, which isolates and seals the moisture in the external environment. Therefore, by providing the second organic isolation groove U3 in the organic insulation layer 205*b*, and allowing the second organic isolation groove U3 to be distributed around the display region 200*a* of the unit display portion 200, in the case that the side wall of the second organic isolation groove U3 is covered with the first inorganic encapsulation layer 205*a* and the second inorganic package layer 205*c* made of the inorganic materials, the moisture in the external environment is effectively prevented from entering the display region 200*a* of the unit display portion 200 through the organic package layer 205*b*, and the probability of the failure of the light-emitting device 200*c* due to erosion by moisture is further reduced. Moreover, by covering the side wall of the second organic insulation groove U3 with the first inorganic package layer 205*a* and the second inorganic package layer 205*c*, it is also possible to prevent an undesirable phenomenon of spillage of the organic package layer 205*b*.

Figure 9:
FIG. 9 is a schematic diagram of the film layer structure of the display panel illustrated in FIG. 5 at E-E'.
Figure 9:
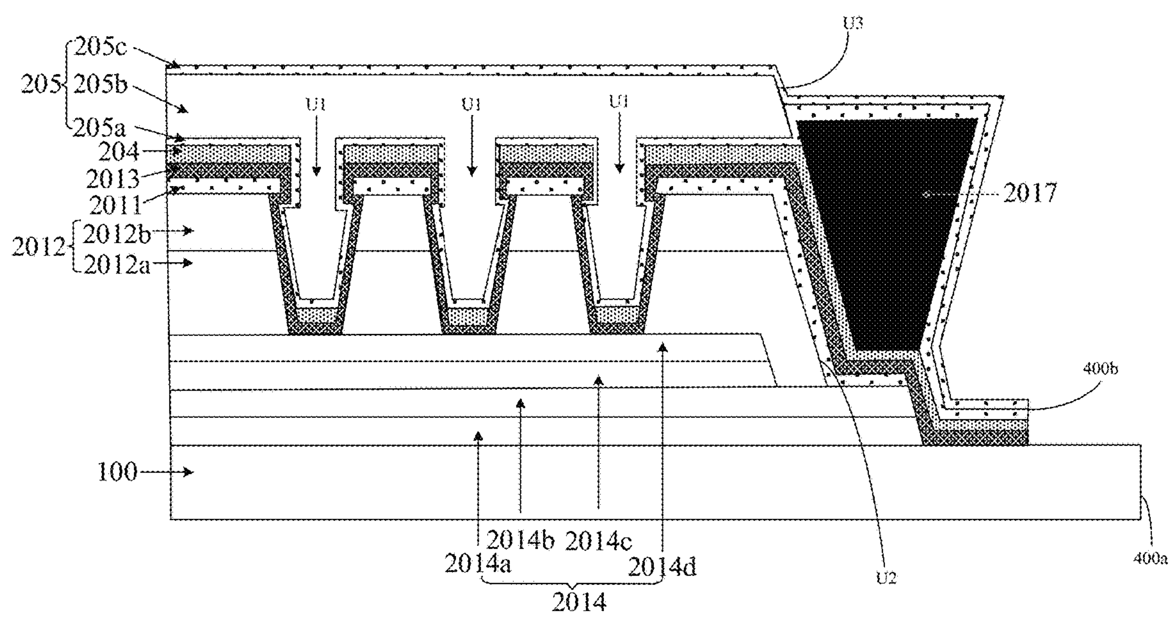

In the embodiments of the present disclosure, as illustrated in FIG. 9, FIG. 9 is a schematic diagram of the film layer structure of the display panel illustrated in FIG. 5 at E-E'. The drive backplane 201 in the unit display portion 200 further includes barrier columns 2017 disposed in the non-display region 200*b*. The barrier columns 2017 are annular, and distributed around the periphery of the display region 200*a* of the unit display portion 200. Here, the barrier columns 2017 are distributed on an outermost side, distal from the flexible substrate 100, of the drive backplane 201. That is, in the preparation process of the drive backplane 201, the barrier columns 2017 are prepared at last. In some embodiments, in the direction parallel to the flexible substrate 100, a cross-sectional width of each barrier column 2017 gradually increases in a direction of the drive backplane 200 away from the flexible substrate 100. That is, a cross-sectional shape of the barrier column 2017 is inverted trapezoidal.

In this case, it is ensured that the barrier columns 2017 block the organic package layer 205*b* in the package layer 205, to prevent the organic package layer 205*b* from outward spillage in the formation process because of its strong fluidity, such that the organic package layer 205*b* in the package layer 205 is only distributed in a region surrounded by the barrier columns 2017. That is, the distribution positions of the barrier columns 2017 are coincident at least partially with the distribution position of the second organic isolation groove U3. In this way, it is ensured that the package layer 205 effectively encapsulates the light-emitting device 200*c* in the unit display portion 200. In addition, the barrier columns 2017 anchor the inorganic package layers (i.e., the first inorganic package layer 205*a* and the second inorganic package layer 205*c*) in the package layer 205, in order to prevent cracks and film layer separation and other undesirable phenomena produced on the edge of the hollowed structure 400 from propagating to the inside of the display region 200*a* of the unit display portion 200, thereby further improving the stability of the unit display portion 200.

It should be noted that there are a plurality of positions for the barrier columns 2017 distributed in the drive backplane 201. The embodiments of the present disclosure are illustrated by taking the following three optional implementations as examples.

The first optional implementation is illustrated in FIG. 9, in which the barrier columns 2017 in the drive backplane 201 are distributed on a side of the first organic isolation groove U2. In this case, the side of the first organic isolation groove U2 is a slope, and a slope angle of this slope is slow. Therefore, in the case that the barrier columns 2017 are distributed on the side of the first organic isolation groove U2, an encapsulation space of the package layer 205 in the unit display portion 200 is reduced by means of the inclined side of the first organic isolation groove U2.

Figure 10:
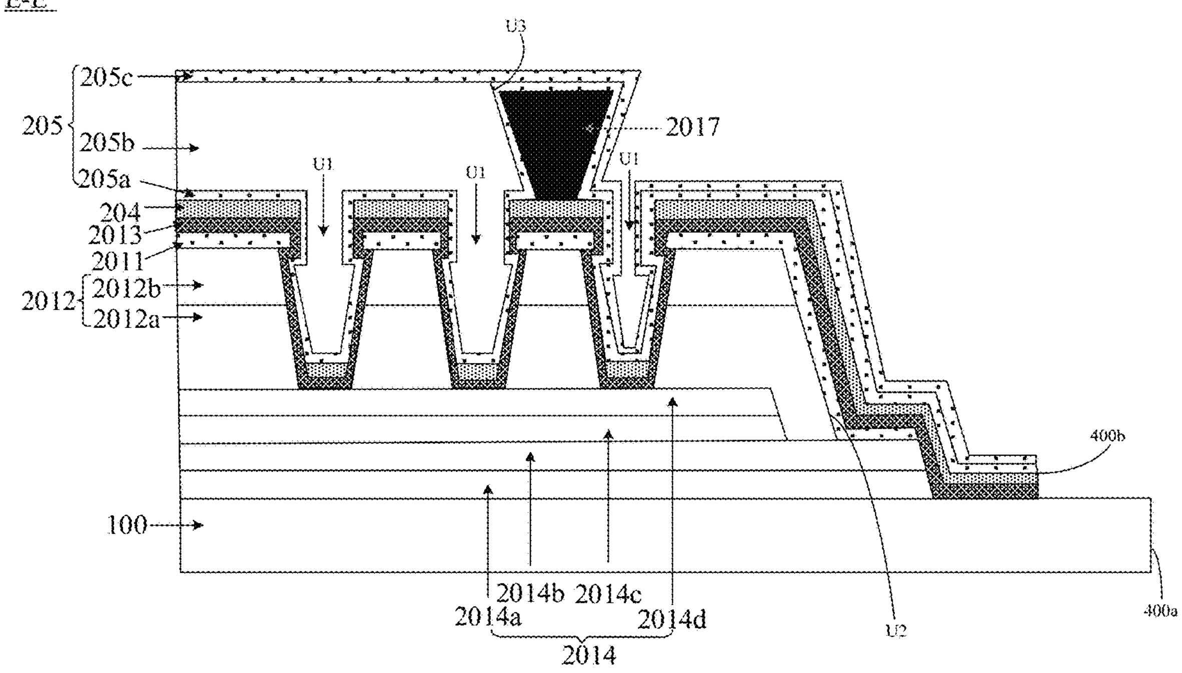
FIG. 10 is a schematic diagram of another film layer structure of the display panel illustrated in FIG. 5 at E-E'.

The second optional implementation is illustrated in FIG. 10. FIG. 10 is a schematic diagram of another film layer structure of the display panel at E-E', in which the barrier columns 2017 in the drive backplane 201 are distributed between two adjacent partition grooves U1. In some embodiments, in the case of three partition grooves U1 in the drive backplane 201, the first partition groove U1, the second partition groove U1 and the third partition groove U1 are nested sequentially in a direction away from the display region 200*a*, and the barrier columns 2017 in the drive backplane 201 are distributed between the second partition groove U1 and the third partition groove U1.

Figure 11:
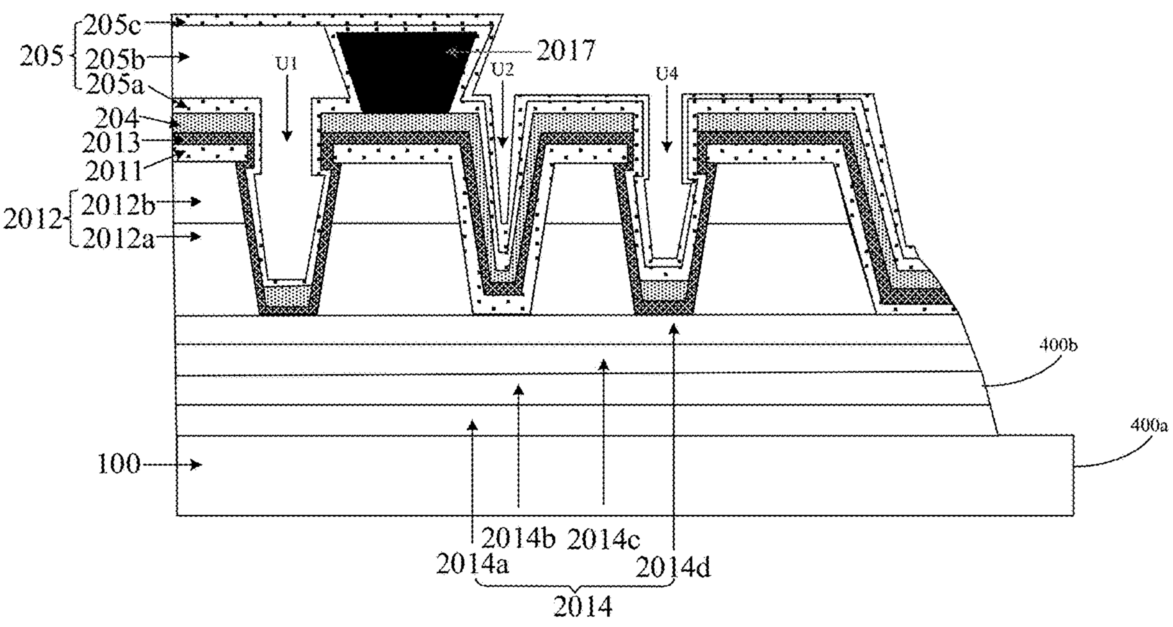
FIG. 11 is a schematic diagram of another film layer structure of the display panel illustrated in FIG. 5 at E-E'.

The third optional implementation is illustrated in FIG. 11. FIG. 11 is a schematic diagram of another film layer structure of the display panel at E-E'. As illustrated in FIG. 11, The barrier columns 2017 in the drive backplane 201 are distributed between the partition groove U1 and the first organic isolation groove U2.

In the present disclosure, as illustrated in FIG. 11, the drive backplane 201 in the unit display portion 200 is further provided with an auxiliary partition groove U4 disposed in the non-display region 200*b*. The auxiliary partition groove U4 is annular, and annularly distributed on the periphery of the display region 200*a*. The auxiliary partition groove U4 is disposed adjacent to the first organic isolation groove U2 which is more proximal to the display region 200*a* than the auxiliary partition groove U4. Here, the auxiliary partition groove U4 plays the same role as the partition groove U2. That is, the auxiliary partition groove U4 is also configured to separate the cathode layer 204. In some embodiments, a portion of the cathode layer 204 disposed in the auxiliary partition groove U4 is disconnected from a portion of the cathode layer 204 disposed outside the auxiliary partition groove U4. By providing the auxiliary partition groove U4 in a side, distal from the display region 200*a*, of the first organic isolation groove U2, the probability that the moisture is transferred through the cathode layer 204 to the light-emitting layer 203 in the display region 200*a* of the unit display portion 200 is further reduced.

In some embodiments, as illustrated in FIG. 5 and FIG. 6, the display panel 000 includes a plurality of hollowed structures 400. In order to ensure that the display panel 000 is stretched normally, it is necessary to ensure that the hollow structures 400 run through the entire display panel 000. For example, the flexible substrate 100 in the display panel 000 is provided with a first hollowed hole 400*a*, the film layer structure in the stretchable display panel 000 other than the flexible substrate 100 is provided with a second hollowed hole 400*b*, and the first hollowed hole 400*a* is communicated with the second hollowed hole 400*b*. Here, the first hollowed hole 400*a* and the second hollowed hole 400*b* which are communicated with each other define the hollowed structure 400 in the display panel 000. The first hollowed hole 400*a* is surrounded by a plurality of island regions 102 and a plurality of bridge regions 101 in the flexible substrate 100, and the second hollowed hole 400*b* is surrounded by the unit display portions 200 disposed on the island regions 102 and the connecting portions 200 disposed on the bridge regions 101.

In the present disclosure, a side of the flexible substrate 100 proximal to the hollowed structure 400 is more protrusive than a side of the first inorganic package layer 205*a* proximal to the hollowed structure 400, and also more protrusive than a side of the second inorganic package layer 205*c* proximal to the hollowed structure 400. In this way, in the process of tensile deformation of the display panel 000, a portion that needs to be deformed around the hollowed structure 400 is the flexible substrate 100, such that the deformation ability of the display panel 000 is further improved, and the stress borne by the inorganic layers (for example, the first inorganic package layer 205*a* and the second inorganic package layer 205*c*) in the display panel 000 is reduced, thereby improving the stability of the display panel 000.

In some embodiments, as illustrated in FIG. 6 and FIG. 8, the pixel definition layer 206 in the unit display portion 200 is also provided with at least one cathode lap via 206*b*, in addition to at least one pixel hole 206*a*. Correspondingly, the anode layer 202 in the unit display portion 200 includes at least one anode block 2021 in one-to-one correspondence to at least one pixel hole 206*a*, and at least one cathode lapping electrode 2022 in one-to-one correspondence to at least one cathode lap via 206*b*.

Each anode block 2021 is disposed in the corresponding pixel hole 206*a*. Here, for any pixel hole 206*a* in the pixel definition layer 206, the anode block 2021 disposed in this pixel hole 206*a* is configured as an anode in the light-emitting device 200*c*, the light-emitting layer 203 disposed in this pixel hole 206*a* is configured as a light-emitting portion in the light-emitting device 200*c*, and the cathode layer 204 disposed in this pixel hole 206*a* is configured as a cathode in the light-emitting device 200*c*. In this way, in the same light-emitting device 200*c*, by means of the mutual cooperation of the anode and the cathode, the light-emitting portion between the anode and the cathode emits light.

Each cathode lapping electrode 2022 is disposed in the corresponding cathode lap via 206*b*, and the cathode lapping electrode 2022 is electrically connected to a first power signal line L0 in the drive backplane 201. Here, the first power signal line L0 disposed in the drive backplane 201 is a low-level power signal line, that is, a VSS signal line. The cathode layer 204 disposed in the unit display portion 200 is lapped with the cathode lapping electrode 2022 by the cathode lap via 206*b*. In this way, the cathode layer 204 is electrically connected to the first power signal line L0 disposed in the drive backplane 201 through the cathode lapping electrode 2022.

It should be noted that the pixel hole 206*a* and the cathode lap via 206*b* in the pixel definition layer 206 are both disposed in a region surrounded by the partition groove U1.

It should also be noted that the pixel hole 206*a* in the pixel definition layer 206 is disposed in the display region 200*a* of the unit display portion 200, and the cathode lap via 206*b* in the pixel definition layer 206 is disposed in the non-display region 200*b* of the unit display portion 200. In this way, in the process of forming the light-emitting layer 203 by means of an evaporation process, a fine mask plate is configured to evaporate a luminescent material only in the display region 200*a*, rather than a luminescent material in the non-display region 200*b*, such that the light-emitting layer 203 is normally formed in the pixel hole 206*a*, but not formed in the cathode lap via 206*b*. Therefore, the cathode lapping electrode 2022 in the cathode lap via 206*b* is normally lapped with the cathode layer 204.

Figure 12:
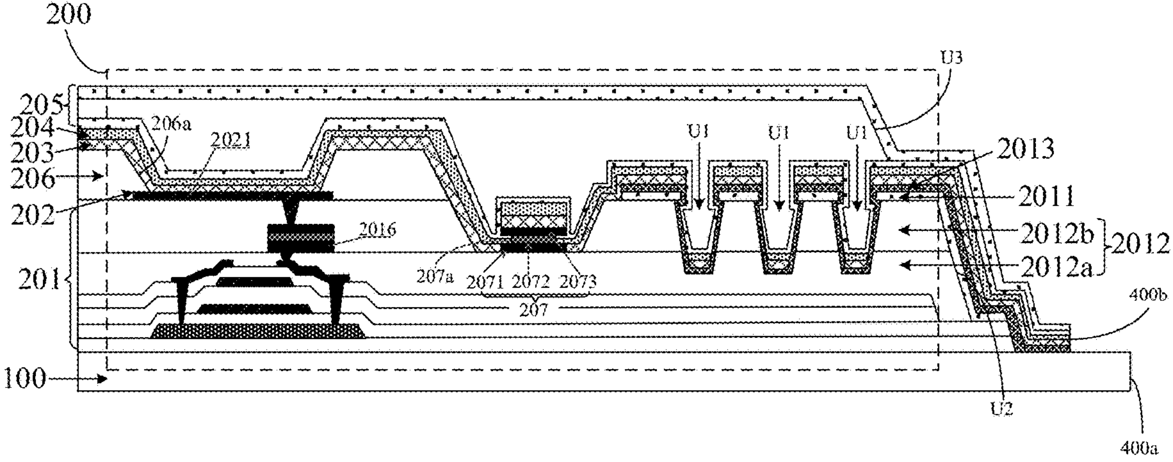
FIG. 12 is a schematic diagram of another film layer structure of the unit display portion illustrated in FIG. 5 at B-B'.

In other possible implementations, the light-emitting layer 203 in the display panel 000 is also formed by evaporation using an open mask plate for the entire layer. In this case, the light-emitting layer 203 is not only distributed within the display region 200*a* of the unit display portion 200, but is also distributed within the non-display region 200*b* of the unit display portion 200. FIG. 12 is a schematic diagram of another film layer structure of the unit display portion illustrated in FIG. 5 at B-B'. A portion of the light-emitting layer 203 is disposed in the partition groove U1 in the drive backplane 201, and the portion of the light-emitting layer 203 disposed in the partition groove U1 is disconnected from a portion of the light-emitting layer 203 disposed outside the partition groove U1. It should be noted that the principle of disconnecting the portion of the light-emitting layer 203 disposed inside the partition groove U1 from the portion of the light-emitting layer 203 disposed outside the partition groove U1 refers to the principle of disconnecting the portion of the light-emitting layer 203 disposed in the partition groove U1 from the portion of the light-emitting layer 204 disposed outside the partition groove U1, which will not be repeated here.

In this case, the light-emitting layer 204 is separated by the partition groove U1. Thus, even if the light-emitting layer 203 provided around the hollowed structure 400 is exposed to the external environment, and the light-emitting layer 203 also absorbs moisture in the external environment, the moisture entering the light-emitting layer 203 is blocked by the partition groove U1, such that the moisture is not transferred through the light-emitting layer 203 to the light-emitting layer 203 in the display region 200*a* of the unit display portion 200, thereby further reducing the probability of the failure of the light-emitting device 200*c* due to erosion by moisture.

In some embodiments, the unit display portion 200 also includes an auxiliary electrode 207. In the direction parallel to the flexible substrate 100, the auxiliary electrode 207 in the unit display portion 200 is more proximal to the display region 200*a* of the unit display portion 200 than the partition groove U1. That is, the auxiliary electrode 207 is disposed in a region surrounded by the partition groove U1. The auxiliary electrode 207 in the unit display portion 200 is provided with a groove 207*a* in a side wall, and is electrically connected to the first power signal line disposed in the drive backplane 201. Here, the first power signal line is a VSS power signal line.

A portion of the light-emitting layer 203 disposed on the auxiliary electrode 207 is disconnected from a portion of the light-emitting layer 203 disposed outside the auxiliary electrode 207. Here, the portion of the light-emitting layer 203 disposed on the auxiliary electrode 207 refers to a portion of the light-emitting layer 203 in contact with the auxiliary electrode 207, and the portion of the light-emitting layer 203 disposed outside the auxiliary electrode 207 refers to a portion of the light-emitting layer 203 not in contact with the auxiliary electrode 207.

In the present disclosure, since the auxiliary electrode 207 is provided with the groove 207*a* in the side wall, in the case that the light-emitting layer 203 is formed on the auxiliary electrode 207 by means of the evaporation process, the portion of the light-emitting layer 203 disposed on the auxiliary electrode 207 is disconnected from the portion of the light-emitting layer 203 disposed outside the auxiliary electrode 207. In this way, in the case that the subsequent formation of the cathode layer 204 on the light-emitting layer 203, the cathode layer 204 extends to the groove 207*a* in the side wall of the auxiliary electrode 207, and is in contact with the groove 207*a*, such that the cathode layer 204 is electrically connected to the auxiliary electrode 207. Thus, the cathode layer 204 is electrically connected to the first power signal line L0 in the drive backplane 201 via the auxiliary electrode 207.

In some embodiments, as illustrated in FIG. 12, the auxiliary electrode 207 in the unit display portion 200 includes a first sub-electrode 2071, a second sub-electrode 2072 and a third sub-electrode 2073 which are stacked. Here, the second sub-electrode 2072 is disposed between the first sub-electrode 2071 and the third sub-electrode 2073, and the first sub-electrode 2071 is more proximal to the flexible substrate 100 than the third sub-electrode 2073.

In the direction parallel to the flexible substrate 100, the first sub-electrode 2071 is more protrusive than the second sub-electrode 2072, and the third sub-electrode 2073 is more protrusive than the second sub-electrode 2072. Thus, a portion of the first sub-electrode 2071 which is more protrusive than the second sub-electrode 2072, a portion of the third sub-electrode 2073 which is more protrusive than the second sub-electrode 2072, and a side wall of the second sub-electrode 2072 defines the groove 207*a*. In the present disclosure, the cathode layer 204 is in contact with the portion of the first sub-electrode 2071 which is more protrusive than the second sub-electrode 2072, such that the cathode layer 204 is electrically connected with the auxiliary electrode 207.

In some embodiments, a material of the first sub-electrode 2071 is the same as that of the third sub-electrode 2072, but is different from that of the second sub-electrode 2072. For example, the first sub-electrode 2071 and the third sub-electrode 207 are made of metallic titanium, while the second sub-electrode 2072 is made of metallic aluminum. In this way, in the process of forming the auxiliary electrode 207 by means of a composition process, a first etching material with a small lateral etching rate is employed to etch the metallic titanium to obtain the third sub-electrode 2073; then, a second etching material with a large lateral etching rate is employed to etch the metallic aluminum to obtain the second sub-electrode 2072; and finally, the first etching material is employed again to etch the metallic titanium to obtain the first sub-electrode 2071. Thus, the auxiliary electrode 207 with the groove 207*a* in the side wall is obtained.

It should be noted that the auxiliary electrode 207 in the unit display portion 200 is disposed in the same layer and made of the same material as the anode layer 202, or is disposed in the same layer and made of the same material as a conductive structure in the drive backplane 201. For example, FIG. 12 is illustrative of the auxiliary electrode 207 and a connecting electrode 2016 in the drive backplane 201 (described below).

It should also be noted that in the case that the auxiliary electrode 207 is disposed in the same layer and made of the same material as the conductive structure in the drive backplane 201, the conductive structure in the drive backplane 201 is a signal line, and the formation of a groove in a side wall of the signal line will affect a signal transmission effect of the signal line. Therefore, in the process of simultaneously forming the auxiliary electrode 207 and the conductive structure in the drive backplane 201, the groove 207*a* is no longer formed in the side wall of the auxiliary electrode 207. In order to form the groove 207*a* in the side wall of the auxiliary electrode 207, the second sub-electrode 2072 in the auxiliary electrode 207 is etched alone before the formation of the light-emitting layer 203. However, in the process of etching the second sub-electrode 2072 in the auxiliary electrode 207 alone, because the conductive structure in the drive backplane 201 is protected by the second planarization layer 2012*b*, no groove is formed in the side wall of the conductive structure in the drive backplane 201.

In the embodiments of the present disclosure, as illustrated in FIG. 6 and FIG. 8, the drive backplane 201 in the unit display portion 200 includes at least one pixel drive circuit 2015 electrically connected to the at least one anode block 2021 in one-to-one correspondence. In the case that each pixel drive circuit 2015 is electrically connected to the corresponding anode block 2021, this pixel drive circuit 2015 applies a driving signal to the corresponding anode block 2021 to drive the corresponding light-emitting device 200*c* to emit light.

Figure 13:
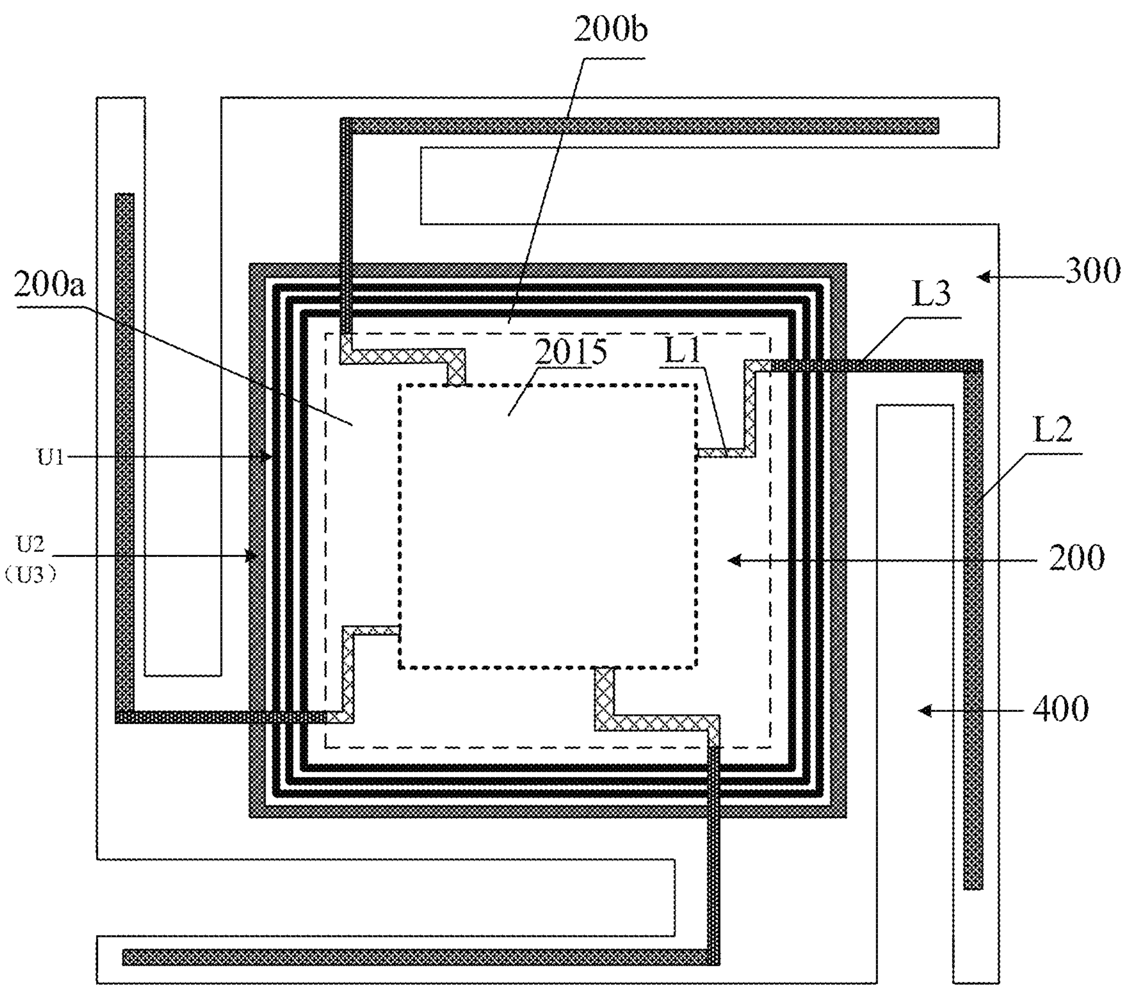
FIG. 13 is another schematic structural diagram of an individual unit display portion in the display panel illustrated in FIG. 1.

In the present disclosure, FIG. 13 is another schematic structural diagram of an individual unit display portion of the display panel illustrated in FIG. 1. The drive backplane 201 in the unit display portion 200 further includes a plurality of first signal lines L1 electrically connected to the pixel drive circuit 2015. The plurality of first signal lines L1 provide different signals to the pixel drive circuit 2015, such that the pixel drive circuit 2015 drives the corresponding light-emitting devices 200*c* to emit light. In some embodiments, the plurality of first signal lines L1 electrically connected to the same pixel drive circuit 2015 include at least one of a first power signal line L0, a second power signal line, a data signal line, a gate line and a reset signal line. The first power signal line L0 is a VSS signal line, and the second power signal line is a high-level power signal line, that is, a VDD signal line.

The connecting portion 300 includes a plurality of second signal lines L2. The plurality of second signal lines L2 distributed in each connecting portion 300 also include at least one of the first power signal line L0, the second power signal line, the data signal line, the gate line and the reset signal line.

The stretchable display panel 000 also includes a plurality of connecting signal lines L3. Here, one portion of each connecting signal line L3 is disposed in the unit display portion 200, and the other portion thereof is disposed in the connecting portion 300. That is, each connecting signal line L3 runs through the partition groove U1 disposed in the non-display region 200*b* of the unit display portion 200.

In the stretchable display panel 000, the plurality of connecting signal lines L3 are in one-to-one correspondence to the plurality of first signal lines L1, and a first end of each connecting signal line L3 is electrically connected to the corresponding first signal line L1. The plurality of connecting signal lines L3 are also in one-to-one correspondence to the plurality of second signal lines L2, and a second end of each connecting signal line L3 is electrically connected to the corresponding second signal line L2.

In this case, since the connecting signal lines L3 run through the partition groove U1 disposed in the non-display region 200*b* of the unit display portion 200, the same signal lines in the unit display portions 200 and in the connecting portions 300 are connected in series by the connecting signal lines L3. In this way, the same signal lines in different unit display portions 200 are connected in series by the signal lines disposed in the connecting portions 300.

In the embodiments of the present disclosure, in order to ensure that the display panel 000 is stretched normally, it is necessary to make the connecting portion 300 in the display panel 000 have a certain deformation ability. Since the inorganic layer generally has a large stress, it is necessary to remove the inorganic layer disposed in the connecting portion 300 as much as possible, in order to improve the deformation ability of the connecting portion 300. In this case, the multilayer inorganic layer 2014 disposed in the display panel 000 is only provided in the drive backplane 201 of the unit display portion 200, and these inorganic layers 2014 disposed in the connecting portion 300 are removed.

In some embodiments, as illustrated in FIG. 6, the unit display portion 200 in the drive backplane 201 in the display panel 000 further includes a first planarization layer 2012*a* covering the pixel drive circuit 2015, a connecting electrode 2016 disposed on a side, distal from the flexible substrate 100, of the first planarization layer 2012*a*, and a second planarization layer 2012*b* disposed on a side, distal from the flexible substrate 100, of the connecting electrode 2016. The pixel drive circuit 2015 is electrically connected to the corresponding anode block 2021 by the connecting electrode 2016. It should be noted that herein, the first planarization layer 2012*a* and the second planarization layer 2012*b* which are stacked define the organic insulation layer 2012 in the above embodiments. It should also be noted that the multilayer inorganic layers 2014 in the drive backplane 201 are all disposed on a side, distal from the second planarization layer 2012*b*, of the first planarization layer 2012*a*. These inorganic layers 2014 are configured to insulate a plurality of conductive layers forming the pixel drive circuit 2015.

The connecting portion 300 in the display panel 000 further includes a third planarization layer 301 disposed in a same layer and made of a same material as the first planarization layer 2012*a*, and a fourth planarization layer 302 disposed in a same layer and made of a same material as the second planarization layer 2012*b*. It should be noted that two structures in the embodiments of the present disclosure being disposed in the same layer and made of the same material means that: these two structures are formed by means of the same composition process, wherein the composition process includes: film deposition, photoresist coating, exposure, development, etching and photoresist peeling. For example, the first planarization layer 2012*a* being disposed in the same layer and made of the same material as the third planarization layer 301 means that: the first planarization layer 2012*a* and the third planarization layer 301 are formed by means of the same composition process.

In the present disclosure, in order to ensure a high deformation ability of the connecting portion 300, an organic layer at a side, proximal to the flexible substrate 100, of the third planarization layer 301 needs to be removed from the connecting portion 300. Thus, within the connecting portion 300, a portion of the third planarization layer 301 is in direct contact with the flexible substrate 100.

In the embodiments of the present disclosure, more second signal lines L2 are disposed in the connecting portion 300. In order to enable these second signal lines L2 to transmit signals normally, these second signal lines L2 are arranged in a double-layer wiring manner. In some embodiments, within the connecting portion 300, one portion of the plurality of second signal lines L2 is disposed between the flexible substrate 100 and the third planarization layer 301, and the other portion of the second signal lines L2 is disposed between the third planarization layer 301 and the fourth planarization layer 302.

In some embodiments, the pixel drive circuit 2015 disposed in the drive backplane 201 in the unit display portion 200 includes a storage capacitor Cst and at least one transistor. Here, each transistor in the pixel drive circuit 2015 is a thin-film transistor.

The storage capacitor Cst has a first capacitive electrode C1 and a second capacitive electrode C2 which are disposed to face each other. Here, an orthographic projection of the first capacitive electrode C1 on the flexible substrate 100 has an overlapping region with an orthographic projection of the second capacitive electrode C2 on the flexible substrate 100, and the first capacitive electrode C1 and the second capacitive electrode C2 are insulated from each other. The first capacitive electrode C1 is more proximal to the flexible substrate 100 than the second capacitive electrode C2.

The transistor has a gate G, an active layer Act insulated from the gate G, and a source and drain that laps with the active layer Act. Here, the source and drain of the transistor are a source S and a drain D. One of the source S and the drain D in the transistor is electrically connected to the corresponding anode block 2022 by the connecting electrode 2016. Here, the first capacitive electrode C1 in the storage capacitor Cst is disposed in a same layer and made of a same material as the gate G in the transistor.

In the present disclosure, the active layer Act in the transistor is more proximal to the flexible substrate 100 than the gate G. A buffer layer 2014*a* is disposed between the flexible substrate 100 and a semiconductor layer where the active layer Act is disposed. The buffer layer 2014*a* ensures that the active layer Act is normally formed on the flexible substrate 100. A first gate insulation layer 2014*b* is disposed between a conductive layer where the gate G is disposed and the semiconductor layer where the active layer Act is disposed, and the active layer Act is insulated from the gate G in the transistor by the first gate insulation layer 2014*b*. A second gate insulation layer 2014*c* is disposed between the conductive layer where the first capacitive electrode C1 is disposed and the conductive layer where the second capacitive electrode C2 is disposed, and the first capacitive electrode C1 is insulated from the second capacitive electrode C2 in the storage capacitor Cst by the second gate insulation layer 2014*c*. The source and drain of the transistor are disposed on a side, distal from the flexible substrate 100, of the second capacitive electrode C2, and an interlayer dielectric layer 2014*d* is disposed between a conductive layer where the source and drain of the transistor is disposed and the conductive layer where the second capacitive electrode C2 is disposed. The first planarization layer 2012*a* is disposed on a side, distal from the flexible substrate 100, of the source and drain of the transistor.

In the present disclosure, the partition groove U1 in the drive backplane 201 runs through the first planarization layer 2012*a* and the second planarization layer 2012*b* at the same time, or only runs through the second planarization layer 2012*b*. Thus, the embodiments of the present disclosure will be exemplarily described by taking the following two cases as examples.

In the first case, in the case that the partition groove U1 in the driving backplane 201 runs through the first planarization layer 2012*a* and the second planarization layer 2012*b* at the same time, in order to cause the connecting signal lines L3 in the display panel 000 to run through the partition groove U1 without any interference, it is necessary to arrange these connecting signal lines L3 in at least one of the conductive layer where the first capacitive electrode C1 is disposed and the conductive layer where the second capacitive electrode C2 is disposed. That is, the plurality of connecting signal lines L3 in the display panel 000 are disposed in the same layer and made of the same material as at least one of the first capacitive electrode C1 and the second capacitive electrode C2. In this case, since the interlayer dielectric layer 2014*d* is disposed between the conductive layer where the second capacitive electrode C2 is disposed and the bottom of the partition groove U1, in the case that the connecting signal lines L3 are disposed in the same layer and made of the same material as the second capacitive electrode C2, the partition groove U1 in the drive backplane 201 does not affect the connecting signal lines L3 disposed in the same layer as the second capacitive electrode C2 under the protection of the interlayer dielectric layer 2014*d*, such that the connecting signal lines L3 normally run through the partition groove U1. Similarly, in the case that the connecting signal lines L3 are disposed in the same layer and made of the same material as the first capacitive electrode C1, under the protection of the interlayer dielectric layer 2014*d* and the second gate insulation layer 2014*c*, the partition groove U1 disposed in the drive backplane 201 does not affect the connecting signal lines L3 disposed in the same layer and made of the same material as the first capacitive electrode C1, such that the connecting signal lines L3 normally run through the partition groove U1.

In some embodiments, in order to ensure that the plurality of connecting signal lines L3 transmit signals normally, one portion of the plurality of connecting signal lines L3 is disposed in the same layer and made of the same material as the first capacitive electrode C1, and the other portion of the connecting signal lines L3 is disposed in the same layer and made of the same material as the second capacitive electrode C2, such that the plurality of connecting signal lines L3 is distributed in a double-layer wiring manner.

In the second case, in the case that the partition groove U1 in the drive backplane 201 run through the second planarization layer 2012*ba*, but not the first planarization layer 2012*a*, in order to enable the connecting signal lines L3 in the display panel 000 to run through the partition groove U1 without any interference, it is necessary to arrange these connecting signal lines L3 in at least one of the conductive layer where the source and drain of the transistor is disposed, the conductive layer where the first capacitive electrode C1 is disposed and the conductive layer where the second capacitive electrode C2 is disposed. That is, the plurality of connecting signal lines L3 in the display panel 000 are disposed in the same layer and made of the same material as at least one of the source and drain of the transistor, the first capacitive electrode C1 and the second capacitive electrode C2. In this case, since the first planarization layer 2012*a* is disposed between the conductive layer where the source and drain of the transistor is disposed and the bottom of the partition groove U1, in the case that the connecting signal lines L3 are disposed in the same layer and made of the same material as the source and drain of the transistor, the partition groove U1 in the drive backplane 201 does not affect the connecting signal lines L3 disposed in the same layer as the source and drain of the transistor under the protection of the first planarization layer 2012*a*, such that the connecting signal lines L3 normally runs through the partition groove U1. Similarly, in the case that the connecting signal lines L3 are disposed in the same layer and made of the same material as the second capacitive electrode C2 or the first capacitive electrode C1, under the protection of the first planarization layer 2012*a*, the partition groove U1 disposed in the drive backplane 201 does not affect the connecting signal lines L3 disposed in the same layer and made of the same material as the first capacitive electrode C1 or the second capacitive electrode C2, such that the connecting signal lines L3 normally run through the partition groove U1.

In the embodiments of the present disclosure, one portion of the plurality of second signal lines L2 in the connecting portion 300 is disposed between the flexible substrate 100 and the third planarization layer 301, and the other portion of the second signal lines L2 is disposed between the third planarization layer 301 and the fourth planarization layer 302. Therefore, the second signal lines disposed between the flexible substrate 100 and the third planarization layer 301 among the plurality of second signal lines L2 are disposed in the same layer and made of the same material. For example, these second signal lines are disposed in the same layer and made of the same material as the source and drain of the transistor. The second signal lines disposed between the third planarization layer 301 and the fourth planarization layer 302 among the plurality of second signal lines L2 are disposed in the same layer and made of the same material. For example, these second signal lines are disposed in the same layer and made of the same material as the connecting electrode 2016.

In some embodiments, the connecting portion 300 further includes at least one inorganic protective layer 303 disposed on a side, distal from the flexible substrate 100, of the fourth planarization layer 302. The inorganic protective layer 303 in the connecting portion 300 covers the fourth planarization layer 302. Thus, the fourth planarization layer 302 is covered with the inorganic protective layer 303, which prevents the fourth planarization layer 302 from an undesirable phenomenon of spillage. In the present disclosure, since deformation of the connecting portion 300 is significant in the process of stretching the display panel, it is necessary to ensure that a thickness of the inorganic layer in the connecting portion 300 is small. Thus, the inorganic protective layer 303 in the connecting portion 300 is disposed in the same layer and made of the same material as the first inorganic package layer 205*a* and/or the second inorganic package layer 205*c*. That is, the fourth planarization layer 302 in the connecting portion 300 is protected under the premise that the thickness of the inorganic layer in the connecting portion 300 is small.

Figure 14:
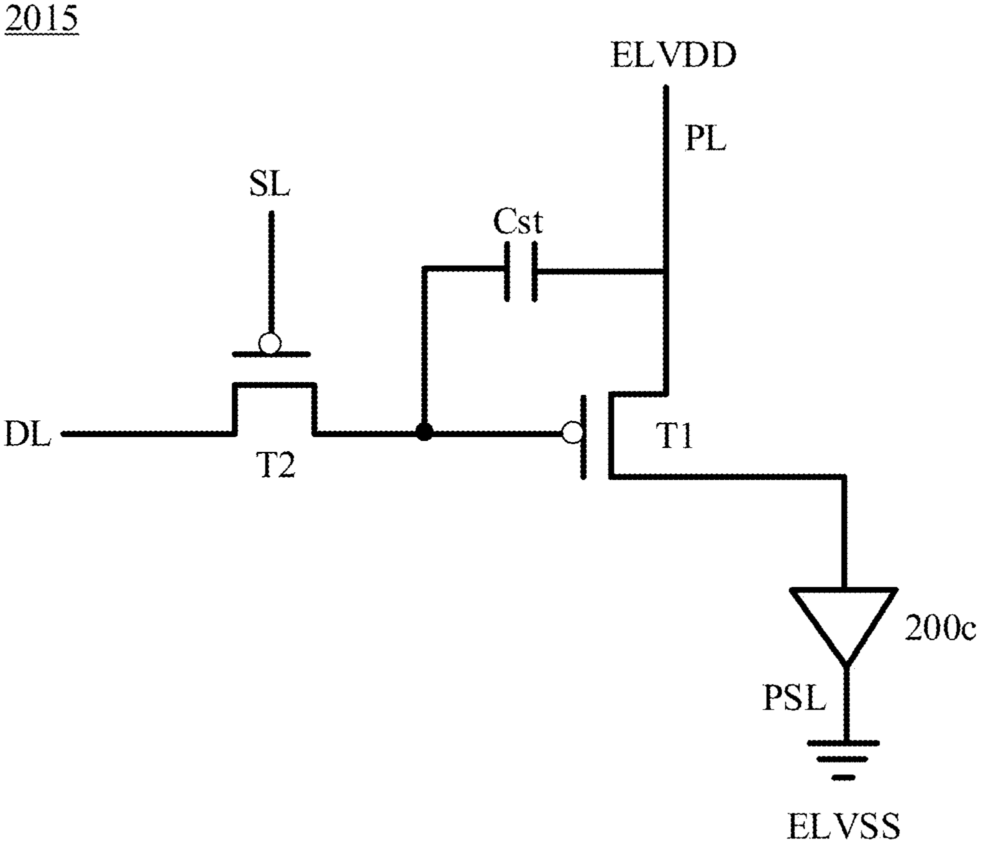
FIG. 14 is an equivalent circuit diagram of a pixel drive circuit according to some embodiments of the present disclosure.

In the embodiments of the present disclosure, in order to more clearly see the pixel drive circuit 2015, referring to FIG. 14, FIG. 14 is an equivalent circuit diagram of a pixel drive circuit according to some embodiments of the present disclosure. At least one transistor in the pixel drive circuit 2015 includes a drive transistor T1 and a switching transistor T2. It should be noted that a first electrode in the following embodiments refers to one of the source and the drain, and a second electrode refers to the other one of the source and the drain.

Here, a gate of the switching transistor T2 in the pixel drive circuit 2015 is electrically connected to a scan line SL, a first electrode of the switching transistor T2 is electrically connected to a data line DL, and a second electrode of the switching transistor T2 is electrically connected to a gate of the drive transistor T1 in the pixel drive circuit 2015. In this way, based on a switching voltage received from the scan line SL, a data voltage received from the data line DL is transmitted to the drive transistor T1.

One capacitive electrode in the storage capacitance Cst in the pixel drive circuit 2015 is electrically connected to the gate of the switching transistor T2, and the other capacitive electrode is connected to a drive voltage line PL (i.e., the second power signal line in the above embodiments). In this way, the storage capacitor stores a voltage difference between the voltage received from the switching transistor T2 and a high-level voltage ELVDD received from the drive voltage line PL.

The first electrode of the drive transistor T1 is electrically connected to the drive voltage line PL and the other capacitive electrode in the storage capacitor Cst, and the first electrode of the drive transistor T1 is electrically connected to the light-emitting device 200*c*. In this way, the drive thin-film transistor T1 controls the voltage difference stored by the storage capacitor Cst, and a drive current flowing from the drive voltage line PL to the light-emitting device 200*c*. The light-emitting device 200*c* emits light of brightness corresponding to this drive current.

A cathode in the light-emitting device 200*c* receives a low-level voltage ELVSS from a common-voltage line PSL (i.e., the first power signal line in the above embodiments).

It should be noted that the pixel drive circuit 2015 illustrated in FIG. 14 includes two transistors and one storage capacitor Cst, which is not limited in the embodiments. The number of transistors and the number of storage capacitors vary depending on the design of the pixel circuit. In other possible implementations, the pixel drive circuit 2015 includes one or more transistors in addition to the above two transistors.

Figure 15:
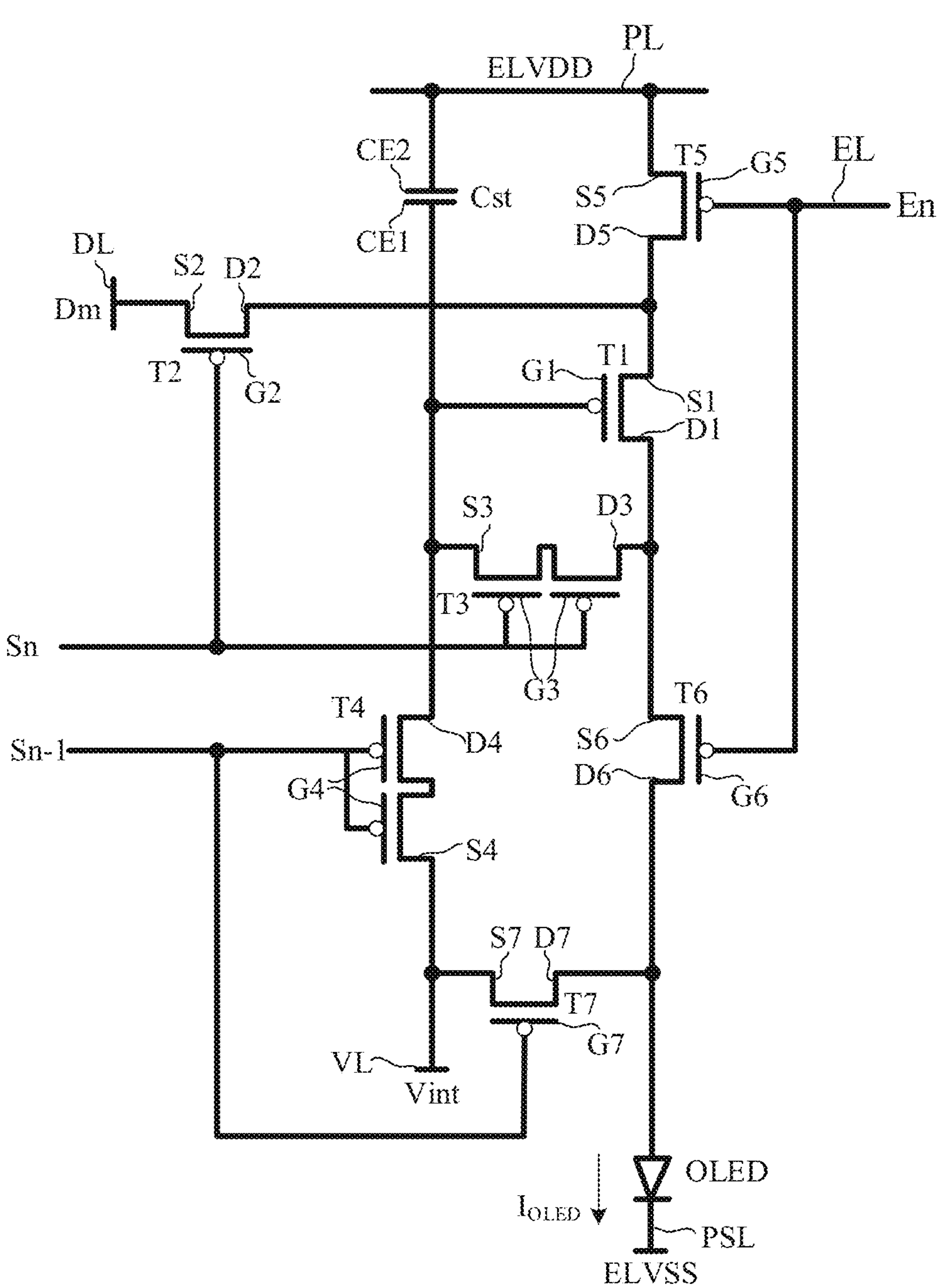
FIG. 15 is an equivalent circuit diagram of another pixel drive circuit according to some embodiments of the present disclosure.

In some embodiments, referring to FIG. 15, FIG. 15 is an equivalent circuit diagram of another pixel drive circuit according to some embodiments of the present disclosure. The pixel drive circuit 2015 includes a plurality of transistors and storage capacitors Cst. The transistors and the storage capacitors Cst are connected to signal lines SL, SIL, EL, and DL, an initialization voltage line VL, and the drive voltage line PL.

The plurality of transistor includes a drive transistor T1, a switching transistor T2, a compensation transistor T3, a first initialization transistor T4, an operation control transistor T5, an emission control transistor T6 and a second initialization transistor T7. The signal lines include a scan line SL configured to transmit a scan signal Sn, a previous scan line SIL configured to transmit a previous scan signal Sn−1 to the first initialization transistor T4 and the second initialization transistor T7, an emission control line EL configured to transmit an emission control signal En to the operation control transistor T5 and the emission control transistor T6, and a data line DL configured to transmit a data signal Dm to the drive transistor T1. The drive voltage line PL transmits a high-level voltage ELVDD to the drive transistor T1, the initialization voltage line VL transmits an initialization voltage Vint, and the initialization voltage Vint initializes the drive transistor T1 and the anode of the light-emitting device 200*c*.

A drive gate electrode G1 of the drive transistor T1 is connected to a lower electrode CE1 of the storage capacitor Cst, a drive source S1 of the drive transistor T1 is connected to the drive voltage line PL by the operation control transistor T5, and a drive drain D1 of the drive transistor T1 is electrically connected to the anode of the light-emitting device 200*c* by the emission control transistor T6. The drive transistor T1 receives a data signal Dm according to a switching operation of the switching transistor T2, and supplies a drive current IOLED to the light-emitting device 200*c*.

A switching gate electrode G2 of the switching transistor T2 is connected to the scan line SL, a switching source S2 of the switching transistor T2 is connected to the data line DL, and a drain D2 of the switching transistor T2 is connected to the drive source S1 of the drive transistor T1 and to the drive voltage line PL by the operation control transistor T5. The switching transistor T2 is switched on in response to the scan signal Sn received from the scan line SL to perform the switching operation of transmitting the data signal Dm received from the data line DL to the drive source S1 of the drive transistor T1.

A compensation gate electrode G3 of the compensation transistor T3 is connected to the scan line SL, a compensation source S3 of the compensation transistor T3 is connected to the drive drain D1 of the drive transistor T1 and to the anode of the light-emitting device 200*c* by the emission control transistor T6, and a compensation drain D3 of the compensation transistor T3 is connected to the lower electrode CE1 of the storage capacitor Cst, a first initialization drain D4 of the first initialization transistor T4 and the drive gate electrode G1 of the drive transistor T1. The compensation transistor T3 is switched on in response to the scan signal Sn received from the scan line SL, and the drive gate electrode G1 is electrically connected to the drive drain D1 of the drive transistor T1 so as to be connected to the drive transistor T1 in the form of a diode.

The first initialization gate electrode G4 of the first initialization transistor T4 is connected to the previous scan line SIL, a first initialization source S4 of the first initialization transistor T4 is connected to a second initialization drain D7 of the second initialization transistor T7 and an initialization voltage line VL, and a first initialization drain D4 of the first initialization transistor T4 is connected to the lower electrode CE1 of the storage capacitor Cst, the compensation drain D3 of the compensation transistor T3 and the drive gate electrode G1 of the drive transistor T1. The first initialization transistor T4 is switched on in response to a previous scan signal Sn−1 received from the previous scan line SIL, and the voltage of the drive gate electrode G1 of the drive transistor T1 is initialized by transmitting the initialization voltage Vint to the drive gate electrode G1 of the drive transistor T1.

An operation control gate electrode G5 of the operation control transistor T5 is connected to the emission control line EL, an operation control source S5 of the operation control transistor T5 is connected to the drive voltage line PL, and an operation control drain D5 of the operation control transistor T5 is connected to the drive source S1 of the drive transistor T1 and the drain D2 of the switching transistor T2.

An emission control gate electrode G6 of the emission control transistor T6 is connected to the emission control line EL, an emission control source S6 of the emission control transistor T6 is connected to the drive drain D1 of the drive transistor T1 and the compensation source S3 of the compensation transistor T3, and an emission control drain D6 of the emission control transistor T6 is electrically connected to a second initialization source S7 of the second initialization transistor T7 and the anode of the light-emitting device 200*c*.

The operation control transistor T5 and the emission control transistor T6 are simultaneously switched on in response to the emission control signal En received from the emission control line EL, such that the high-level voltage ELVDD is transmitted to the light-emitting device 200*c*, and the drive current IOLED travels through the light-emitting device 200*c*.

A second initialization gate electrode G7 of the second initialization transistor T7 is connected to the previous scan line SIL, a second initialization source S7 of the second initialization transistor T7 is connected to the emission control drain D6 of the emission control transistor T6 and the anode of the light-emitting device 200*c*, and a second initialization drain D7 of the second initialization transistor T7 is connected to the first initialization source S4 of the first initialization transistor T4 and the initialization voltage line VL. The second initialization transistor T7 is switched on in response to the previous scan signal Sn−1 received from the previous scan line SIL to initialize the anode of the light-emitting device 200*c*.

Although FIG. 15 illustrates a case where the first initialization transistor T4 and the second initialization transistor T7 are connected to the same initialization voltage line VL, in some embodiments, the first initialization transistor T4 is connected to the first initialization voltage line, and the second initialization transistor T7 is connected to the second initialization voltage line.

Further, although FIG. 15 illustrates a case where the first initialization transistor T4 and the second initialization transistor T7 are connected to the previous scan line SIL, in some embodiments, the first initialization transistor T4 is connected to the previous scan line SIL and driven according to the previous scan signal Sn−1, and the second initialization transistor T7 is connected to a separate signal line such as the next scan line and driven according to the signal received from the signal line.

An upper electrode CE2 of the storage capacitor Cst is connected to the drive voltage line PL. In addition, opposing electrodes of the light-emitting device 200*c* are connected to a common voltage line PSL to receive the low-level voltage ELVSS. Therefore, the light-emitting device 200*c* receives the drive current IOLED from the driver transistor T1, and emits light to display an image.

It should be noted that FIG. 15 illustrates that the compensation transistor T3 and the first initialization transistor T4 have dual gate electrodes. However, in other embodiments, the compensation transistor T3 and the first initialization transistor T4 have one gate electrode.

It should also be noted that each transistor in the above pixel drive circuit 2015 is a low-temperature poly-silicon thin film transistor (LTPS TFT), or one portion of the plurality of transistors in the pixel drive circuit 2015 is LTPS TFTs, and the other portion of the transistors is oxide transistors.

In summary, the display panel according to the embodiments of the present disclosure includes a flexible substrate, and a plurality of unit display portions disposed on the flexible substrate. The drive backplane in the unit display portion is provided with a partition groove disposed in the non-display region, by which the cathode layer is separated. Therefore, even if the cathode layer disposed around the hollowed structure of the display panel is still exposed to the external environment, and the cathode layer still absorbs moisture in the external environment, the moisture entering the cathode layer is blocked by the partition groove, such that the moisture is not be transferred through the cathode layer to the light-emitting layer in the display region of the unit display portion, such that the package layer in the unit display portion effectively seals the light-emitting device to reduce the probability of failure of the light-emitting device due to erosion by moisture. Therefore, the service life of the display panel is effectively prolonged.

The embodiments of the present disclosure also provide a display apparatus. The display apparatus is any product or component having a display function, such as a mobile phone, a tablet computer, a television, a display, a laptop computer, a digital photo frame or a navigator. The display apparatus includes a power supply component and a display panel 000. The display panel 000 is the display panel 000 in the above embodiments.

In the embodiments of the present disclosure, the display panel 000 is an organic light emitting diode (OELD) display panel, or an active matrix-organic light emitting diode (AM-OLED) display panel, or a quantum dot light emitting diode (QELD) display panel.

It should be noted that in the accompanying drawings, for clarity of the illustration, the dimension of the layers and regions is scaled up. It may be understood that in the case that an element or layer is described as being "above" another element or layer, the described element or layer may be directly on the other element or layer, or at least one intermediate layer may be arranged between the described element or layer and the other element or layer. In addition, it may be understood that in the case that an element or layer is described as being "below" another element or layer, the described element or layer may be directly below the other element or layer, or at least one intermediate layer may be arranged between the described element or layer and the other element or layer. In addition, it may be further understood that in the case that a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

In the present disclosure, the terms "first" and "second" are used for descriptive purposes only and are not to be construed as indicating or implying relative importance. The term "a plurality of" refers to two or more, unless specifically defined otherwise.

The foregoing descriptions are merely optional embodiments of the present disclosure, and are not intended to limit the present disclosure. Within the spirit and principles of the present disclosure, any modifications, equivalent substitutions, improvements, and the like are within the protection scope of the present disclosure.

The invention claimed is:

1. A stretchable display panel, comprising:

a flexible substrate, comprising a plurality of island regions spaced apart from each other and a plurality of bridge regions configured to connect the plurality of island regions, and comprising a first hollowed hole surrounded by the plurality of island regions and the plurality of bridge regions;

a plurality of unit display portions, respectively disposed on the plurality of island regions, wherein each of the plurality of unit display portions comprises a display region and a non-display region on a periphery of the display region, and comprises a drive backplane, and an anode layer, a light-emitting layer, and a cathode layer which are stacked on the drive backplane; and connecting portions, disposed on the plurality of bridge regions and configured to connect the adjacent unit display portions;

wherein the drive backplane comprises a partition groove in the non-display region, and a portion of the cathode layer inside the partition groove is disconnected from a portion of the cathode layer outside the partition groove, and a recessed structure is disposed in an inner wall of the partition groove;

the drive backplane in the unit display portion comprises a first inorganic insulation layer and an organic insulation layer which are stacked, the organic insulation layer being more proximal to the flexible substrate than the first inorganic insulation layer;

wherein the partition groove runs through at least portions of the first inorganic insulation layer and the organic insulation layer, a side of the first inorganic insulation layer proximal to the partition groove is more protrusive than a side of the organic insulation layer proximal to the partition groove and a first organic isolation groove is disposed in a portion of the organic insulation layer in the non-display region; wherein in a direction parallel to the flexible substrate, the partition groove is more proximal to the display region than the first organic isolation groove, and the first inorganic insulation layer covers a side wall of the first organic isolation groove.

2. The stretchable display panel according to claim 1, wherein the partition groove comprises a first sub partition groove in the first inorganic insulation layer, and a second sub partition groove in the organic insulation layer;

wherein an orthographic projection of the first sub partition groove on the flexible substrate is within in an orthographic projection of the second sub partition groove on the flexible substrate, and an outer boundary of the orthographic projection of the second sub partition groove on the flexible substrate is not coincident with an outer boundary of the orthographic projection of the first sub partition groove on the flexible substrate.

3. The stretchable display panel according to claim 1, wherein the drive backplane in the unit display portion further comprises a second inorganic insulation layer on a side, distal from the flexible substrate, of the first inorganic insulation layer, the second inorganic insulation layer covering the partition groove.

4. The stretchable display panel according to claim 1, wherein the drive backplane in the unit display portion further comprises a plurality of inorganic layers stacked on a side of the organic insulation layer proximal to the flexible substrate; wherein an overlapping region is present between an orthographic projection of the first organic isolation groove on the flexible substrate and an orthographic projection of at least one inorganic layer on the flexible substrate.

5. The stretchable display panel according to claim 1, wherein the unit display portion further comprises a first inorganic package layer, an organic package layer, and a second inorganic package layer which are stacked on a side, distal from the drive backplane, of the cathode layer; wherein a second organic isolation groove is disposed in a portion of the organic package layer in the non-display region, wherein an overlapping region is present between an orthographic projection of the second organic isolation groove on the flexible substrate and the orthographic projection of the first organic isolation groove on the flexible substrate; and the first inorganic package layer and the second inorganic package layer both cover a side wall of the second organic isolation groove.

6. The stretchable display panel according to claim 1, wherein the partition groove and the first organic isolation groove are both annular, the partition groove is distributed around the periphery of the display region of the unit display portion, and the first organic isolation groove is distributed around a periphery of the partition groove.

7. The stretchable display panel according to claim 6, wherein a plurality of partition grooves are disposed in each of the unit display portions; and the plurality of partition grooves in the same unit display portion are nested in sequence and are all distributed around the periphery of the display region of the unit display portion.

8. The stretchable display panel according to claim 1, wherein a portion of the light-emitting layer is disposed in the partition groove, and the portion of the light-emitting layer inside the partition groove is disconnected from a portion of the light-emitting layer outside the partition groove.

9. The stretchable display panel according to claim 8, wherein the unit display portion further comprises an auxiliary electrode; in the direction parallel to the flexible substrate, the auxiliary electrode is more proximal to the display region than the partition groove, and a groove is disposed in a side wall of the auxiliary electrode; the auxiliary electrode is configured to be electrically connected to a first power signal line disposed in the drive backplane;

wherein a portion of the light-emitting layer on the auxiliary electrode is disconnected from a portion of the light-emitting layer outside the auxiliary electrode, and the cathode layer extends into the groove and is in contact with the groove.

10. The stretchable display panel according to claim 9, wherein the auxiliary electrode comprises a first sub-electrode, a second sub-electrode and a third sub-electrode which are stacked, the second sub-electrode being disposed between the first sub-electrode and the third sub-electrode, the first sub-electrode being more proximal to the flexible substrate than the third sub-electrode;

wherein in the direction parallel to the flexible substrate, the first sub-electrode is more protrusive than the second sub-electrode, and the third sub-electrode is more protrusive than the second sub-electrode; and the cathode layer is in contact with the first sub-electrode.

11. The stretchable display panel according to claim 1, wherein the unit display portion further comprises a pixel definition layer on the drive backplane, at least one pixel hole and at least one cathode lap via being disposed in the pixel definition layer; and the anode layer comprises at least one anode block in one-to-one correspondence to the at least one pixel hole, and at least one cathode lapping electrode in one-to-one correspondence to the at least one cathode lap via;

wherein the anode block is disposed in the corresponding pixel hole, the cathode lapping electrode is disposed in the corresponding cathode lap via, and the cathode lapping electrode is electrically connected to the first power signal line disposed in the drive backplane; and the cathode layer is lapped with the cathode lapping electrode by the cathode lap via.

12. The stretchable display panel according to claim 11, wherein the drive backplane in the unit display portion comprises at least one pixel drive circuit electrically connected to at least one anode block in one-to-one correspondence, and a plurality of first signal lines electrically connected to the pixel drive circuit;

the connecting portion comprises a plurality of second signal lines; and the stretchable display panel further comprises a plurality of connecting signal lines, one portion of the connecting signal lines being disposed in the unit display portions, the other portion thereof being disposed in the connecting portions;

wherein first ends of the plurality of connecting signal lines are electrically connected to the plurality of first signal lines in one-to-one correspondence, and second ends of the plurality of connecting signal lines are electrically connected to the plurality of second signal lines in one-to-one correspondence.

13. The stretchable display panel according to claim 12, wherein the drive backplane in the unit display portion comprises: a first planarization layer covering the pixel drive circuit, a connecting electrode on a side, distal from the flexible substrate, of the first planarization layer, and a second planarization layer on a side, distal from the first planarization layer, of the connecting electrode, and the pixel drive circuit is electrically connected to the corresponding anode block by the connecting electrode; and the connecting portion further comprises a third planarization layer disposed in a same layer and made of a same material as the first planarization layer, and a fourth planarization layer disposed in a same layer and made of a same material as the second planarization layer, wherein a portion in the third planarization layer is in contact with the flexible substrate, one portion of the plurality of second signal lines is between the flexible substrate and the third planarization layer, and the other portion of the second signal lines is between the third planarization layer and the fourth planarization layer.

14. The stretchable display panel according to claim 13, wherein the pixel drive circuit comprises a storage capacitor and at least one transistor, the storage capacitor having a first capacitive electrode and a second capacitive electrode disposed opposite to each other, the first capacitive electrode being more proximal to the flexible substrate than the second capacitive electrode, the first capacitive electrode being disposed in a same layer and made of a same material as a gate in the transistor; wherein in the case that the partition groove runs through the first planarization layer and the second planarization layer at the same time, the plurality of connecting signal lines are disposed in a same layer and made of a same material as at least one of the first capacitive electrode and the second capacitive electrode; or in the case that the partition groove runs through the second planarization layer but does not run through the first planarization layer, the plurality connecting signal lines is disposed in the same layer and made of the same material as at least one of the first capacitive electrode, the second capacitive electrode and a source and drain of the transistor.

15. A display apparatus, comprising: the stretchable display panel according to claim 1.

16. A display panel, comprising: a flexible substrate, and a plurality of unit display portions on the flexible substrate; wherein the unit display portion comprises a display region and a non-display region on a periphery of the display region, and comprises a drive backplane, and an anode layer, a light-emitting layer, and a cathode layer which are stacked on the drive backplane, wherein the drive backplane comprises a partition groove in the non-display region, and a portion of the cathode layer inside the partition groove is disconnected from a portion of the cathode layer outside the partition groove, and a recessed structure is disposed in an inner wall of the partition groove;

the drive backplane in the plurality of unit display portion comprises a first inorganic insulation layer and an organic insulation layer which are stacked, the organic insulation layer being more proximal to the flexible substrate than the first inorganic insulation layer;

wherein the partition groove runs through at least portions of the first inorganic insulation layer and the organic insulation layer, a side of the first inorganic insulation layer proximal to the partition groove is more protrusive than a side of the organic insulation layer proximal to the partition groove, and a first organic isolation groove is disposed in a portion of the organic insulation layer in the non-display region; wherein in a direction parallel to the flexible substrate, the partition groove is more proximal to the display region than the first organic isolation groove, and the first inorganic insulation layer covers a side wall of the first organic isolation groove.

* * * * *